(12) United States Patent
Akiyama et al.

(10) Patent No.: US 11,909,386 B2
(45) Date of Patent: Feb. 20, 2024

(54) GATE DRIVE DEVICE

(71) Applicant: DENSO CORPORATION, Kariya (JP)

(72) Inventors: Hironori Akiyama, Kariya (JP);
Tetsuya Dewa, Kariya (JP)

(73) Assignee: DENSO CORPORATION, Kariya (JP)

( * ) Notice: Subject to any disclaimer, the term of this patent is extended or adjusted under 35 U.S.C. 154(b) by 4 days.

(21) Appl. No.: 17/898,578

(22) Filed: Aug. 30, 2022

(65) Prior Publication Data

US 2022/0416782 A1 Dec. 29, 2022

Related U.S. Application Data

(63) Continuation of application No. PCT/JP2021/006820, filed on Feb. 24, 2021.

(30) Foreign Application Priority Data

Mar. 3, 2020 (JP) ................................. 2020-035779

(51) Int. Cl.
| | | |
|---|---|---|
| *H02M 1/08* | (2006.01) | |
| *H03K 17/16* | (2006.01) | |
| *H03K 17/687* | (2006.01) | |
| *H02M 1/00* | (2006.01) | |
| *H03K 17/284* | (2006.01) | |

(52) U.S. Cl.
CPC ........ *H03K 17/687* (2013.01); *H02M 1/0048* (2021.05); *H02M 1/08* (2013.01); *H03K 17/16* (2013.01); *H03K 17/284* (2013.01)

(58) Field of Classification Search
CPC ....... H02M 1/08; H03K 17/16; H03K 17/161; H03K 17/284; H03K 17/687

USPC ......................................... 327/108, 109, 110
See application file for complete search history.

(56) References Cited

U.S. PATENT DOCUMENTS

| | | | |
|---|---|---|---|
| 9,172,365 B2 * | 10/2015 | Kandah | ............... H03K 17/166 |
| 2003/0045041 A1 | 3/2003 | Katoh et al. | |
| 2003/0201516 A1 | 10/2003 | Katoh et al. | |
| 2007/0187217 A1 | 8/2007 | Tai | |
| 2019/0089346 A1 | 3/2019 | Kawai | |
| 2019/0363706 A1 * | 11/2019 | Shinomiya | ........... H03K 17/145 |
| 2020/0021282 A1 * | 1/2020 | Yamamoto | ......... H03K 17/0822 |
| 2021/0006243 A1 * | 1/2021 | Takagiwa | ......... H03K 17/08128 |
| 2021/0036697 A1 * | 2/2021 | Yamamoto | ......... H03K 17/0822 |
| 2021/0258004 A1 | 8/2021 | Akiyama et al. | |
| 2022/0416782 A1 * | 12/2022 | Akiyama | ........... H03K 17/0822 |

(Continued)

OTHER PUBLICATIONS

U.S. Appl. No. 17/898,557, filed Aug. 30, 2022, Akiyama et al.

*Primary Examiner* — William Hernandez
(74) *Attorney, Agent, or Firm* — POSZ LAW GROUP, PLC

(57) ABSTRACT

A gate drive device drives a gate of each of two semiconductor switching elements constituting upper and lower arms of a half bridge circuit. The gate drive device detects a peak value of an element voltage that is a voltage of a main terminal of one of the two semiconductor switching elements, as one semiconductor switching element, or a change rate of the element voltage during a change period in which the element voltage changes. The gate drive device determines whether an energization to the one semiconductor switching element during the change period is a forward energization in which a current flows in a forward direction or a reverse energization in which the current flows in a reverse direction.

14 Claims, 13 Drawing Sheets

(56) References Cited

U.S. PATENT DOCUMENTS

2023/0021657 A1 1/2023 Akiyama
2023/0114152 A1 4/2023 Akiyama et al.

* cited by examiner

GATE DRIVE DEVICE

CROSS REFERENCE TO RELATED APPLICATIONS

The present application is a continuation application of International Patent Application No. PCT/JP2021/006820 filed on Feb. 24, 2021, which designated the U.S. and claims the benefit of priority from Japanese Patent Application No. 2020-035779 filed on Mar. 3, 2020. The entire disclosures of all of the above applications are incorporated herein by reference.

TECHNICAL FIELD

The present disclosure relates to a gate drive device that drives gates of semiconductor switching elements constituting upper and lower arms of a half bridge circuit.

BACKGROUND

In a gate drive device that drives gates of semiconductor switching elements constituting upper and lower arms of a half bridge circuit, when a surge applied to a main terminal of the semiconductor switching element exceeds an element withstand voltage which is a withstand voltage of the semiconductor switching element, since there is a possibility that a failure occurs, countermeasures against the failure are required. In the present specification, the semiconductor switching element constituting the upper arm of the half bridge circuit may be referred to as an upper element, and the semiconductor switching element constituting the lower arm of the half bridge circuit may be referred to as a lower element. In the present specification, energization in which a current in a forward direction flows through the semiconductor switching element may be referred to as forward energization, and energization in which a current in a reverse direction flows through the semiconductor switching element may be referred to as reverse energization.

SUMMARY

The present disclosure provides a gate drive device. The gate drive device drives a gate of each of two semiconductor switching elements constituting upper and lower arms of a half bridge circuit. The gate drive device detects a peak value of an element voltage that is a voltage of a main terminal of one of the two semiconductor switching elements, as one semiconductor switching element, or a change rate of the element voltage during a change period in which the element voltage changes. The gate drive device determines whether an energization to the one semiconductor switching element during the change period is a forward energization in which a current flows in a forward direction or a reverse energization in which the current flows in a reverse direction.

BRIEF DESCRIPTION OF DRAWINGS

The features and advantages of the present disclosure will become more apparent from the following detailed description made with reference to the accompanying drawings. In the drawings.

DETAILED DESCRIPTION

Figure 1:
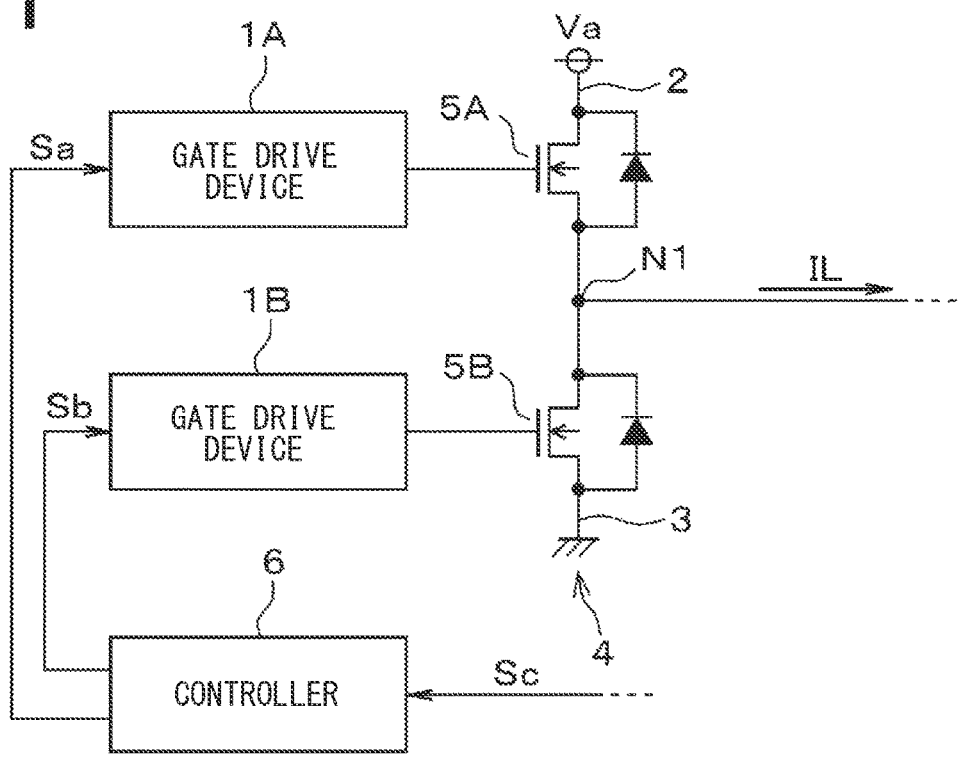
FIG. 1 is a diagram schematically illustrating a schematic configuration of a gate drive device and a half bridge circuit according to a first embodiment.

For example, during a period in which a forward energization is performed on an upper element and a reverse energization is performed on a lower element, a surge voltage is applied to a main terminal of the upper element when the upper element is turned off. Such a surge voltage is referred to as a turn-off surge. The turn-off surge is determined by a product of a slope of an element current flowing through the upper element, that is, a change rate of the element current, and a parasitic inductance of a current path determined by a system structure, and becomes larger as the change rate of the element current becomes larger. Thus, in an exemplary gate drive device, in order to prevent such a turn-off surge from exceeding the element withstand voltage, a gate resistance when the upper element is turned off is selected and is mounted by a chip resistance or the like.

However, a switching loss when the semiconductor switching element is turned off is proportional to the resistance value of the gate resistance when the semiconductor switching element is turned off. Thus, as in the above-described method of the exemplary gate drive device, when a resistance value of the gate resistance when the semiconductor switching element is turned off is set to a fixed value, an effect of suppressing the turn-off surge becomes excessive under an operation condition in which the generated turn-off surge becomes relatively low, and an increase in the switching loss becomes a problem. As described above, there is a trade-off relationship between the suppression of the turn-off surge and the reduction of the switching loss.

For example, a configuration has been proposed in which a drain-source voltage of a semiconductor switching element that is a MOSFET is measured, and a timing of a gate signal given to a gate of the semiconductor switching element is adjusted based on the measurement result. Such timing adjustment can be implemented by changing the gate resistance value or the gate current value. Accordingly, the drain-source voltage of the semiconductor switching element, that is, a surge voltage applied to a main terminal of the semiconductor switching element is measured, and the gate resistance value and the like when the semiconductor switching element is turned off is adjusted according to the measurement result.

The surge applied to the main terminals of the semiconductor switching elements constituting the upper and lower arms of the half bridge circuit includes not only the turn-off surge but also a recovery surge. The recovery surge occurs due to a reverse recovery characteristic of a reflux diode, such as, a body diode connected in reversely parallel to the semiconductor switching element. For example, during a period in which a reverse energization is performed on the upper element and a forward energization is performed on the lower element, the recovery surge is a surge applied to the main terminal of the upper element when the lower element is turned on.

Similar to the turn-off surge, such a recovery surge is determined by a product of a change rate of a current and a parasitic inductance. However, the current in this case corresponds to the recovery current in the reflux diode. Unlike the turn-off surge, the recovery surge has no correlation with the gate resistance value when the upper element is turned off, and can be controlled according to the gate resistance value when the lower element is turned on.

In a gate drive device which has been proposed, timing for measuring a voltage between the drain and the source of the semiconductor switching element, that is, a surge voltage applied to the main terminal of the semiconductor switching element is not disclosed. Thus, there is a possibility that the turn-off surge cannot be appropriately controlled since the gate resistance value and the like is adjusted according to the measurement result of the surge voltage including both the turn-off surge and the recovery surge.

The present disclosure provides a gate drive device capable of appropriately controlling a turn-off surge.

An exemplary embodiment of the present disclosure provides a gate drive device configured to drive a gate of each of two semiconductor switching elements constituting upper and lower arms of a half bridge circuit. The gate drive device includes a detection unit, a determination unit, a calculation unit, and a drive unit. The detection unit is configured to detect, as a detection value, a peak value of an element voltage that is a voltage of a main terminal of one of the two semiconductor switching elements, as one semiconductor switching element, or a change rate of the element voltage during a change period in which the element voltage changes. The determination unit is configured to determine whether an energization to the one semiconductor switching element during the change period is a forward energization in which a current flows in a forward direction or a reverse energization in which the current flows in a reverse direction. The calculation unit is configured to calculate a target instruction value corresponding to a switching speed of the one semiconductor switching element such that the peak value or the change rate becomes equal to or less than a permissible value of the peak value or the change rate determined according to a specification of the one semiconductor switching element based on the detection value during the change period in which the determination unit determines that the energization to the one semiconductor switching element is the forward energization, and the permissible value. The drive unit is configured to change a gate resistance value or a gate current value of the one semiconductor switching element based on the target instruction value, and drive the gate of the one semiconductor switching element.

In the exemplary embodiment of the present disclosure, the peak value of the element voltage and the change rate of the element voltage during the change period is a value corresponding to the magnitude of the surge applied to the main terminal of the semiconductor switching element. Thus, in this case, it can be said that the detection unit detects the magnitude of the surge applied to the main terminal of the one semiconductor switching element.

As described above, the surge applied to the main terminal of the semiconductor switching element includes a turn-off surge and a recovery surge. When the target semiconductor switching element is energized in the forward direction, a turn-off surge is generated, and when the target semiconductor switching element 5 is energized in the reverse direction, a recovery surge is generated. Therefore, in this case, it can be said that the determination unit determines whether the generated surge is a turn-off surge or a recovery surge.

The calculation unit calculates the target instruction value such that the peak value or the change rate of the element voltage becomes equal to or less than the permissible value based on the detection value corresponding to the magnitude of the surge during the change period in which the generated surge is determined to be a turn-off surge and the permissible value.

The drive unit changes the gate resistance value or the gate current value based on the target instruction value calculated using the detection result of the surge voltage including only the turn-off surge. According to such a configuration, the magnitude of the turn-off surge can be controlled such that the peak value or the change rate of the element voltage does not exceed the permissible value, and the switching loss does not increase unnecessarily, in other words, the turn-off surge can be appropriately controlled.

Hereinafter, multiple embodiments will be described with reference to the drawings. Hereinafter, in the respective embodiments, substantially the same configurations are denoted by identical symbols, and repetitive description will be omitted.

First Embodiment

Hereinafter, a first embodiment will be described with reference to FIG. 1 to FIG. 9.
<Schematic Configuration of Gate Drive Device>
As illustrated in FIG. 1, a gate drive device 1A according to a present embodiment drives a semiconductor switching element 5A constituting an upper arm of a half bridge circuit 4 connected between a pair of DC power supply lines 2 and 3. A gate drive device 1B according to the present embodiment drives a semiconductor switching element 5B constituting a lower arm of the half bridge circuit 4. In this case, the gate drive devices 1A and 1B have the same configuration, and the semiconductor switching elements 5A and 5B have the same configuration. Thus, in the present specification, when it is not necessary to distinguish between the gate drive devices 1A and 1B and the semiconductor switching elements 5A and 5B, the alphabets at the ends are omitted and collectively referred to.

The half bridge circuit 4 is included in an inverter that drives a motor (not illustrated). A power supply voltage Va is supplied to the half bridge circuit 4 from a DC power supply (not illustrated) such as a battery via the DC power supply lines 2 and 3. The semiconductor switching element 5 is a power element. In this case, the semiconductor switching element includes an N-channel MOSFET and a reflux diode connected between a drain and a source of the MOSFET with a source side as an anode, that is, connected in reversely parallel to the MOSFET. In this case, although the reflux diode is provided as an element different from the MOSFET, a body diode of the MOSFET may be used as the reflux diode.

A drain of the upper element 5A is connected to the DC power supply line 2 on a high potential side. A source of the upper element 5A is connected to a drain of the lower element 5B. A source of the lower element 5B is connected to the DC power supply line 3 on a low potential side. A node N1 which is an interconnection node between the upper element 5A and the lower element 5B is connected to the motor (not illustrated) described above. As a result, a load current IL which is an output current of the half bridge circuit 4 is supplied to the motor. The controller 6 is an example of a control device that controls the operation of the half bridge circuit 4.

A detection signal Sc indicating a detection value of the load current IL output from a current detection unit (not illustrated) is given to the controller 6. Based on the detection signal Sc, the controller 6 generates and outputs an instruction signal Sa instructing an operation of the gate drive device 1A and an instruction signal Sb instructing an operation of the gate drive device 1B such that the load current IL matches a desired target current. The gate drive device 1A performs PWM control of the driving of the upper element 5A based on the instruction signal Sa given from the controller 6. The gate drive device 1B performs PWM control of the driving of the lower element 5B based on the instruction signal Sb given from the controller 6.

In this case, the upper element 5A and lower element 5B are complementarily turned on and off. Accordingly, the lower element 5B is turned off during a period in which the upper element 5A is turned on, and the upper element 5A is turned off during a period in which the lower element 5B is turned on. In the above configuration, during a period in which the load current IL flows from the node N1 to the motor, the upper element 5A is driven such that the current flows in a forward direction from the drain to the source, and the lower element 5B is driven such that the current flows in a reverse direction from the source to the drain. In the above configuration, during a period in which the load current IL flows from the motor to the node N1, the lower element 5B is driven such that the current flows in the forward direction from the drain to the source, and the upper element 5A is driven such that the current flows in the reverse direction from the source to the drain.

Figure 2:
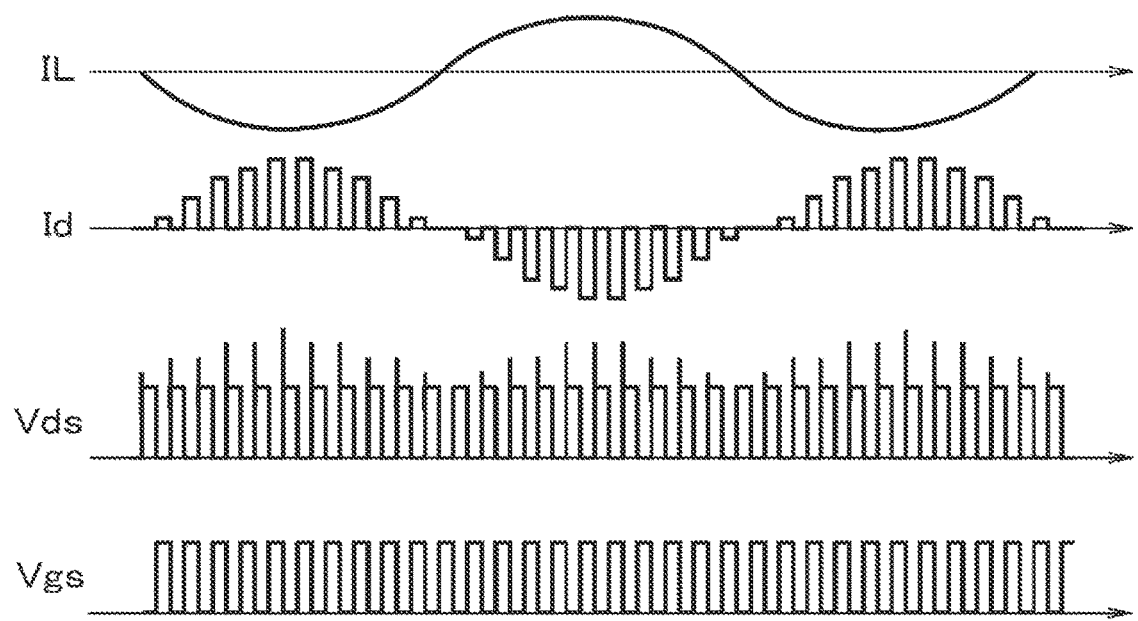
FIG. 2 is a diagram schematically illustrating a load current and waveforms of a current and a voltage related to a semiconductor switching element according to the first embodiment.

As illustrated in FIG. 2, the load current IL is a sinusoidal current. In order to implement the supply of the load current IL, a drain current Id, a drain-source voltage Vds, and a gate-source voltage Vgs of the lower element 5B have waveforms illustrated in FIG. 2. Although illustration of a drain current Id, a drain-source voltage Vds, and a gate-source voltage Vgs of the upper element 5A is omitted, the upper element has similar waveforms to the waveforms of the lower element 5B except that phases are opposite to phases of the waveforms of the lower element.

In this case, the drain-source voltage Vds is a voltage of a main terminal of the semiconductor switching element 5 and corresponds to an element voltage. In this case, the drain current Id is a current flowing through the semiconductor switching element 5 and corresponds to an element current. In the present specification, the drain current Id, the drain-source voltage Vds, and the gate-source voltage Vgs may be simply referred to as a current Id, a voltage Vds, and a voltage Vgs, respectively.

Figure 3:
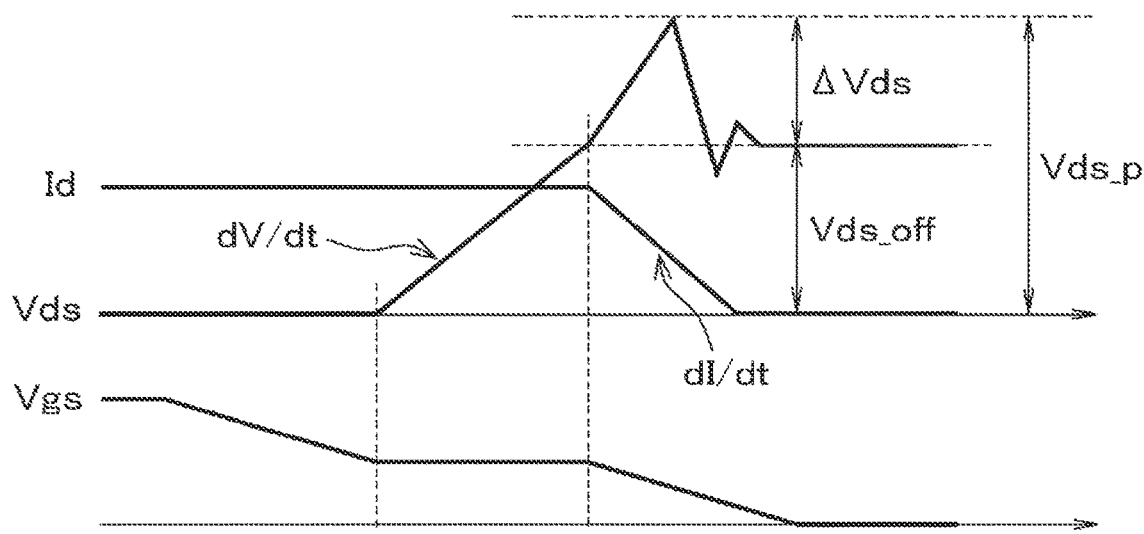
FIG. 3 is a diagram schematically illustrating waveforms of portions when the semiconductor switching element according to the first embodiment is turned off.

The waveforms of the portions when the semiconductor switching element 5 is turned off are as illustrated in FIG. 3. In FIG. 3, although the waveforms of the portions corresponding to the lower element 5B are illustrated, the similar waveforms are applied to the upper element 5A. An off-voltage Vds_off when the lower element 5B is turned off is a voltage substantially equal to the power supply voltage Va. In this case, ΔVds which is a difference between a peak voltage which is a peak value Vds_p of the voltage Vds when the lower element is turned off and the off-voltage Vds_off corresponds to a surge voltage superimposed on the lower element 5B. In this case, a slope of fluctuation of the voltage Vds corresponds to a change rate of the element voltage. In the present specification, the slope of the fluctuation of the voltage Vds may be referred to as dV/dt, and a slope of fluctuation of the current Id may be referred to as dI/dt.

<Functions of Gate Drive Device>

Figure 4:
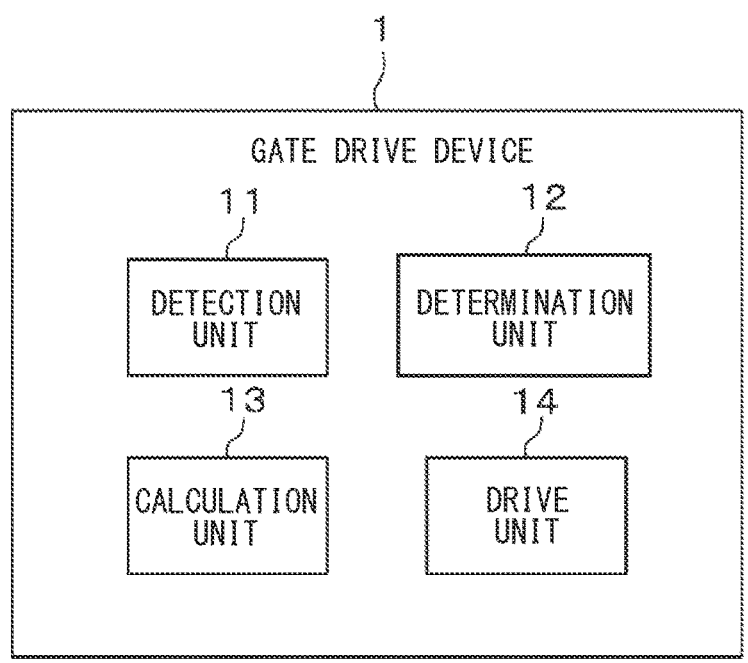
FIG. 4 is a diagram schematically illustrating each function of the gate drive device according to the first embodiment.

Next, each function of the gate drive device 1 will be described with reference to FIG. 4. In FIG. 4 and the like, each function of the gate drive device 1 is represented in the form of a functional block. A specific implementation method of each function will be described later. In the following description, of the two semiconductor switching elements 5, a semiconductor switching element to be driven by the host device is referred to as a semiconductor switching element 5 of the host arm, and a semiconductor switching element to be driven by a gate drive device 1 different from the host device is referred to as a semiconductor switching element 5 of the counter arm. The semiconductor switching element 5 of the host arm corresponds to one semiconductor switching element, and the semiconductor switching element 5 of the counter arm corresponds to another semiconductor switching element.

The detection unit 11 detects the peak value Vds_p of the voltage Vds during the change period in which the voltage Vds of the semiconductor switching element 5 of the host arm, that is, the semiconductor switching element 5 to be driven by the gate drive device 1 changes. The determination unit 12 determines whether the energization to the semiconductor switching element 5 of the host arm during the above-mentioned change period is a forward energization or a reverse energization. In the present embodiment, the discriminating unit 12 directly or indirectly detects the current Id of the semiconductor switching element 5 of the host arm, determines that the energization is the forward energization during the period in which the current Id flows in the forward direction, and determines that the energization is the reverse energization during the period in which the current Id flows in the reverse direction.

The calculation unit 13 calculates a target instruction value corresponding to the switching speed of the semiconductor switching element 5. In this case, the target instruction value is a value that instructs the gate resistance value of the semiconductor switching element 5. The calculation unit 13 calculates the target instruction value such that the peak value Vds_p of the voltage Vds becomes equal to or less than a permissible value based on the detection value by the detection unit 11 during the change period in which the determination unit 12 determines that the energization of the semiconductor switching element 5 of the host arm is forward energization, that is, the detection value of the peak value Vds_p of the voltage Vds, and a permissible value of the peak value Vds_p of the voltage Vds.

The permissible value of the peak value of the voltage Vds is determined according to the specification of the semiconductor switching element 5, and specifically, has the following value. That is, the permissible value is a value lower than a withstand voltage of the semiconductor switching element 5 by a predetermined margin, and is set to such a value that there is no possibility that the semiconductor switching element 5 fails even though a voltage having the value is applied to the main terminal, but there is a possibility that the semiconductor switching element 5 fails when a voltage exceeding the value by the margin or more is applied to the main terminal. In the present embodiment, the calculation unit 13 calculates the target instruction value such that the deviation between the value detected by the detection unit 11 and the predetermined permissible value becomes zero.

A drive unit 14 drives a gate of the semiconductor switching element 5 of the host arm. In this case, the drive unit 14 changes the gate resistance value Rg_off at the time of turn-off of the semiconductor switching element 5 of the host arm based on the target instruction value calculated by the calculation unit 13. Further, in this case, the drive unit 14 completes the change of the gate resistance value Rg_off by the time the semiconductor switching element 5 of the host arm is turned off next time. In the present embodiment, the drive unit 14 continuously switches the gate resistance value Rg_off of the semiconductor switching element 5 of the host arm based on the target instruction value.

<Overview of Processes of Each Functionality>

Figure 5:
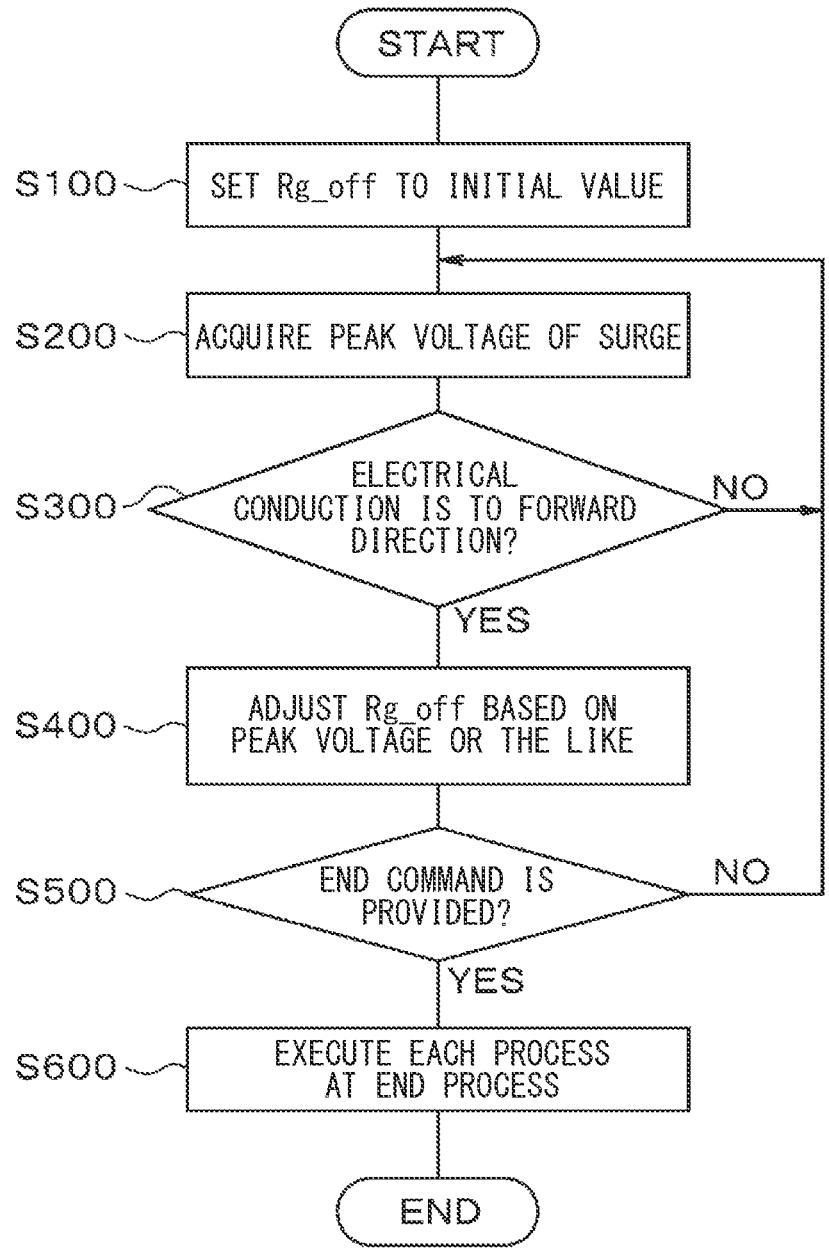
FIG. 5 is a diagram schematically illustrating a flow of processing performed by each function of the gate drive device according to the first embodiment.

Subsequently, an outline of the processing performed by each function of the gate drive device 1 having the above configuration will be described with reference to FIG. 5. As illustrated in FIG. 5, in step S100, which is executed first after the start of the processing, the gate resistance value Rg_off of the host arm is set to the initial value. In this case, the initial value is set to a relatively high value such that the generated surge is sufficiently lower than the withstand voltage of the semiconductor switching element 5. After the execution in step S100, the process proceeds to step S200. In step S200, the detection value of the peak value Vds_p of the voltage Vds, that is, the peak voltage of the surge is acquired.

In step S300, it is determined whether or not the energization to the semiconductor switching element 5, which is the host arm, is the forward energization. Here, when it is determined that the energization is in the reverse energization, that is, when it is determined that the recovery surge is occurring, the determination is NO in step S300, and the process returns to step S200. On the other hand, when it is determined that the energization is forward energization, that is, it is determined that the turn-off surge is occurring, the determination is YES in step S300, and the process proceeds to step S400.

In step S400, the gate resistance value Rg_off is adjusted based on the detection value and the permissible value of the peak value Vds_p. After the execution in step S400, the process proceeds to step S500. In step S500, it is determined whether or not an end instruction has been provided. The above-mentioned end instruction is provided from an upper controller of the gate drive device 1 when the system stops in response to detecting any of faults at a time where the power supply of the device is at an off state. Here, when the end instruction is given, the determination is YES in step S500, and the process proceeds to step S600.

On the other hand, in a situation where the end instruction has not been given, NO is determined in step S500, and the process returns to step S200 and the process subsequent to S200 is repeated. In step S600, each process at the end is executed. Each process at the end includes a process for setting the gate resistance value Rg_off to a predetermined value on the safety side, a process for resetting an integrator when the arithmetic unit 13 is configured to include an integrator, and the like. The predetermined value of the gate resistance value Rg_off on the safety side is set to a relatively high value such that the generated surge is sufficiently lower than the withstand voltage of the semiconductor switching element 5. After execution of step S600, the processing is terminated.

<Specific Configuration of Gate Drive Device>

Figure 6:
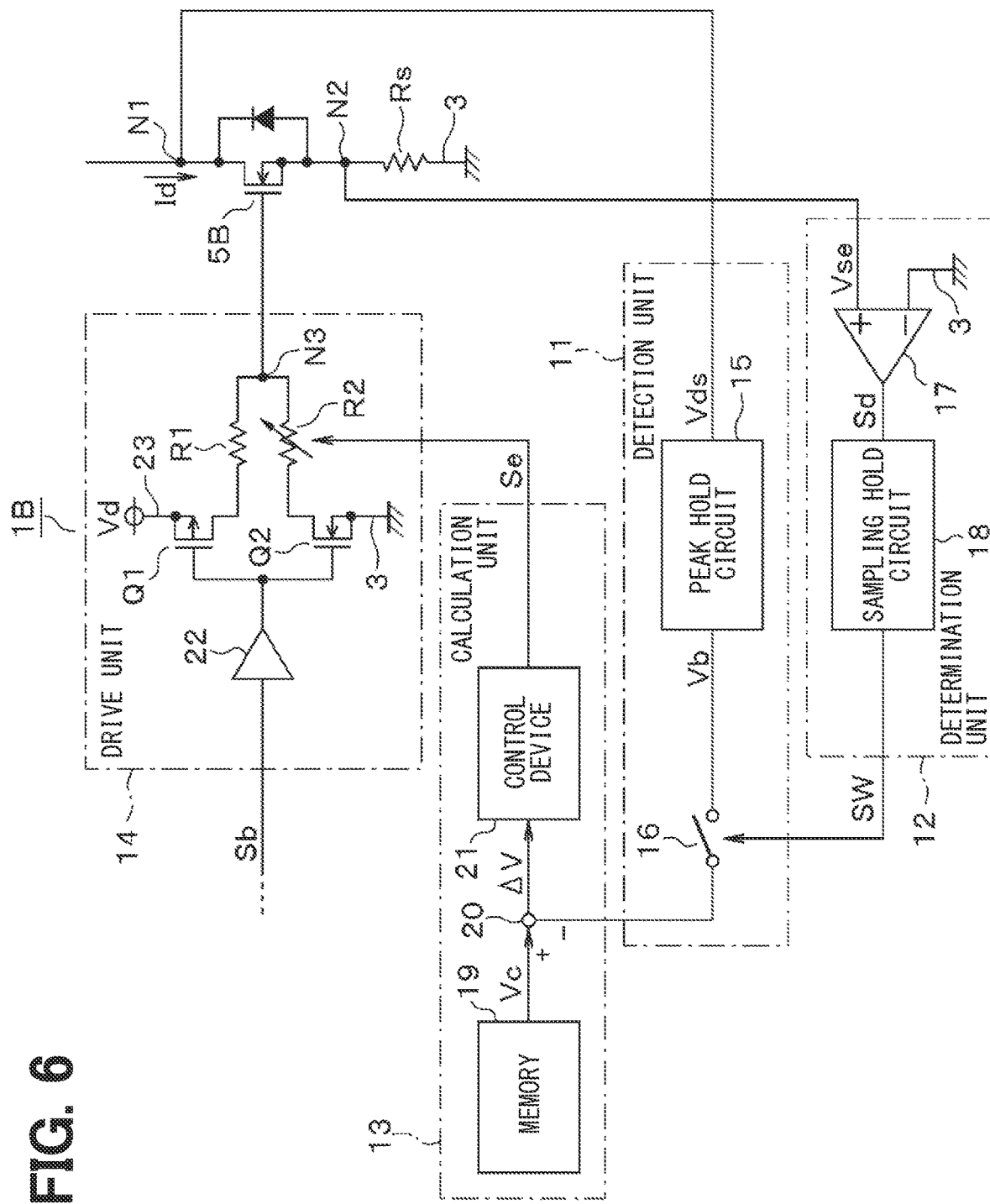
FIG. 6 is a diagram schematically showing a specific configuration example of the gate drive device according to the first embodiment.

As a specific configuration of the gate drive device 1 having each function described above, for example, a configuration example as illustrated in FIG. 6 can be adopted. In FIG. 6, although the specific configuration of the gate drive device 1 is illustrated by taking the gate drive device 1B that drives the lower element 5B as an example, the same configuration can be adopted for the gate drive device 1A that drives the upper element 5A. In this case, a shunt resistor Rs for detecting current Id is inserted in series between the source of the semiconductor switching element 5B and the DC power supply line 3.

In the gate drive device 1 illustrated in FIG. 6, a peak hold circuit 15 and a switch 16 constitute the detection unit 11, a comparator 17 and a sampling hold circuit 18 constitute the determination unit 12, a memory 19, a subtractor 20, and a controller 21 constitute the calculation unit 13. The voltage of the node N1, that is, the drain voltage of the lower element 5B is input to the peak hold circuit 15. The peak hold circuit 15 is a circuit that inputs the drain voltage of the lower element 5B, that is, the voltage Vds when the potential of the source of the lower element 5B is set as a reference, and holds the peak value Vds_p.

That is, the peak hold circuit 15 is provided to acquire a peak voltage of a surge applied to the main terminal of the lower element 5B. The peak hold circuit 15 acquires the peak value Vds_p every time the voltage Vds of the lower element 5B changes, that is, every time the lower element 5B is switched, and outputs the updated value at any time. The peak hold circuit 15 outputs a detection voltage Vb representing a detection value of the peak value Vds_p. In this case, the detection voltage Vb output from the peak hold circuit 15 is given to the subsequent calculation unit 13 via the switch 16. Although the details will be described later, the on/off of the switch 16 is controlled by a signal SW output from the determination unit 12.

A non-inverting input terminal of the comparator 17 is connected to a node N2 which is an interconnection node between the lower element 5B and the shunt resistor Rs. As a result, a voltage Vse obtained by converting a voltage of the current Id flowing through the lower element 5B by the shunt resistor Rs is input to the non-inverting input terminal of the comparator 17. An inverting input terminal of the comparator 17 is connected to the DC power supply line 3 to which 0 V that is a reference potential of the circuit is applied. As a result, the comparator 17 compares the voltage Vse corresponding to the current Id with 0 V, and outputs a binary signal Sd indicating the comparison result.

According to the above configuration, it is possible to determine whether the current Id flows from the drain to the source, that is, whether the current flows in the forward direction, or whether the current Id flows from the source to the drain, that is, whether the current flows in the reverse direction based on the level of the signal Sd output from the comparator 17. Specifically, when the signal Sd is at a high level, it is determined that the current Id is flowing in the forward direction and the energization to the lower element 5B is the forward energization.

When the signal Sd is at a low level, it is determined that the current Id is flowing in the reverse direction and the energization to the lower element 5B is the reverse energization. A threshold value for the determination by the comparator 17 may not be limited to 0 V, and can be appropriately changed as long as the direction of the current Id can be determined. The comparator 17 may have a hysteresis in detection and recovery.

The sampling hold circuit 18 receives the signal Sd output from the comparator 17 and outputs a binary signal SW holding the received signal. In the above configuration, since the current Id flowing through the lower element 5B which is the semiconductor switching element 5 of the host arm is necessarily zero during the counter arm energization which is a period in which the upper element 5A which is the semiconductor switching element 5 of the counter arm is turned on, there is a possibility that the level of the signal Sd output from the comparator 17 does not become a level corresponding to the direction in which the current Id flows.

Thus, the sampling hold circuit 18 samples the signal Sd during the energization of the host arm which is a period in which the lower element 5B is turned on, and complements the signal by holding the sampling result during the energization of the counter arm. According to such a configuration, it is possible to reliably determine the direction of the current Id based on the level of the signal SW output from the sampling hold circuit 18, and eventually, it is possible to reliably determine whether the energization to the lower element 5B is the forward energization or the reverse energization.

When the lower element 5B is energized in the forward direction, the signal SW output from the sampling hold circuit 18 becomes a high level, so that the switch 16 is turned on and the detection voltage Vb output from the peak hold circuit 15 is input to the calculation unit 13. On the other hand, when the lower element 5B is energized in the reverse direction, the signal SW output from the sampling hold circuit 18 becomes a low level, so that the switch 16 is turned off and the detection voltage Vb output from the peak hold circuit 15 is not input to the calculation unit 13. That is, in the above configuration, the detection voltage Vb indicating the detection value of the peak value Vds_p when the lower element 5B is energized in the forward direction, in other words, when a turn-off surge is occurring is input to the calculation unit 13.

The memory 19 stores the permissible value described above, that is, the permissible value of the peak value Vds_p determined according to the specification of the semiconductor switching element 5. The memory 19 outputs a permissible voltage Vc indicating the stored permissible value. Instead of the memory 19, the permissible voltage Vc may be input to the calculation unit 13 from the outside of the gate drive device 1. The permissible voltage Vc is given to the + input of the subtractor 20, and the detection voltage Vb is given to the −input. The subtractor 20 obtains a deviation ΔV corresponding to the difference between the detection value of the peak value Vds_p and the permissible value by subtracting the detection voltage Vb from the permissible voltage Vc, and outputs the deviation ΔV to the controller 21.

The controller 21 is a digital PID controller, and performs a PID calculation for the deviation ΔV to generate an instruction signal Se indicating the target instruction value. The instruction signal Se is output to the drive unit 14. Various types of controllers such as a controller that performs PI calculation, a controller that performs P calculation, and other feedback controllers can be adopted as the controller 21. In the present embodiment, the operation by the PID controller 21 is performed during the period when the detection voltage Vb is input to the calculation unit 13, and is stopped during the period when the detection voltage Vb is not input to the calculation unit 13.

The drive unit 14 is configured to drive the gate of the lower element 5B at a constant voltage, and includes a buffer 22, a transistor Q1 which is a P-channel MOFET, a transistor Q2 which is an N-channel MOSFET, and resistors R1 and R2. The buffer 22 receives, as an input, the instruction signal Sb and outputs a signal corresponding to the input signal. An output terminal of the buffer 22 is connected to each gate of the transistors Q1 and Q2. A source of the transistor Q1 is connected to a DC power supply line 23 to which a power supply voltage Ve is supplied. The power supply voltage Ve is a voltage based on a potential of the DC power supply line 3, and is a voltage sufficiently higher than a gate threshold voltage of the lower element 5B.

A drain of the transistor Q1 is connected to a node N3 via the resistor R1. The node N3 is connected to the gate of the lower element 5B. The resistor R1 functions as a gate resistance when the lower element 5B is turned on together with a wiring resistor of a path from the DC power supply line 23 to the gate of the lower element 5B. The resistor R1 has a constant resistance value. A source of the transistor Q2 is connected to the DC power supply line 3. A drain of the transistor Q2 is connected to the node N3 via the resistor R2.

The resistor R2 functions as a gate resistance when the lower element 5B is turned off together with a wiring resistor of a path from the DC power supply line 3 to the gate of the lower element 5B. The resistor R2 is configured to be able to change a resistance value thereof based on the instruction signal Se given from the calculation unit 13. That is, in the above configuration, the gate resistance value Rg_off when the lower element 5B is turned off is changed based on the instruction signal Se. The resistance value of the resistor R2 can be changed by various methods such as a method using a variable resistor, a method using switching of a resistor ladder, and a method of operating the on-resistance of the transistor Q2.

Figure 7:
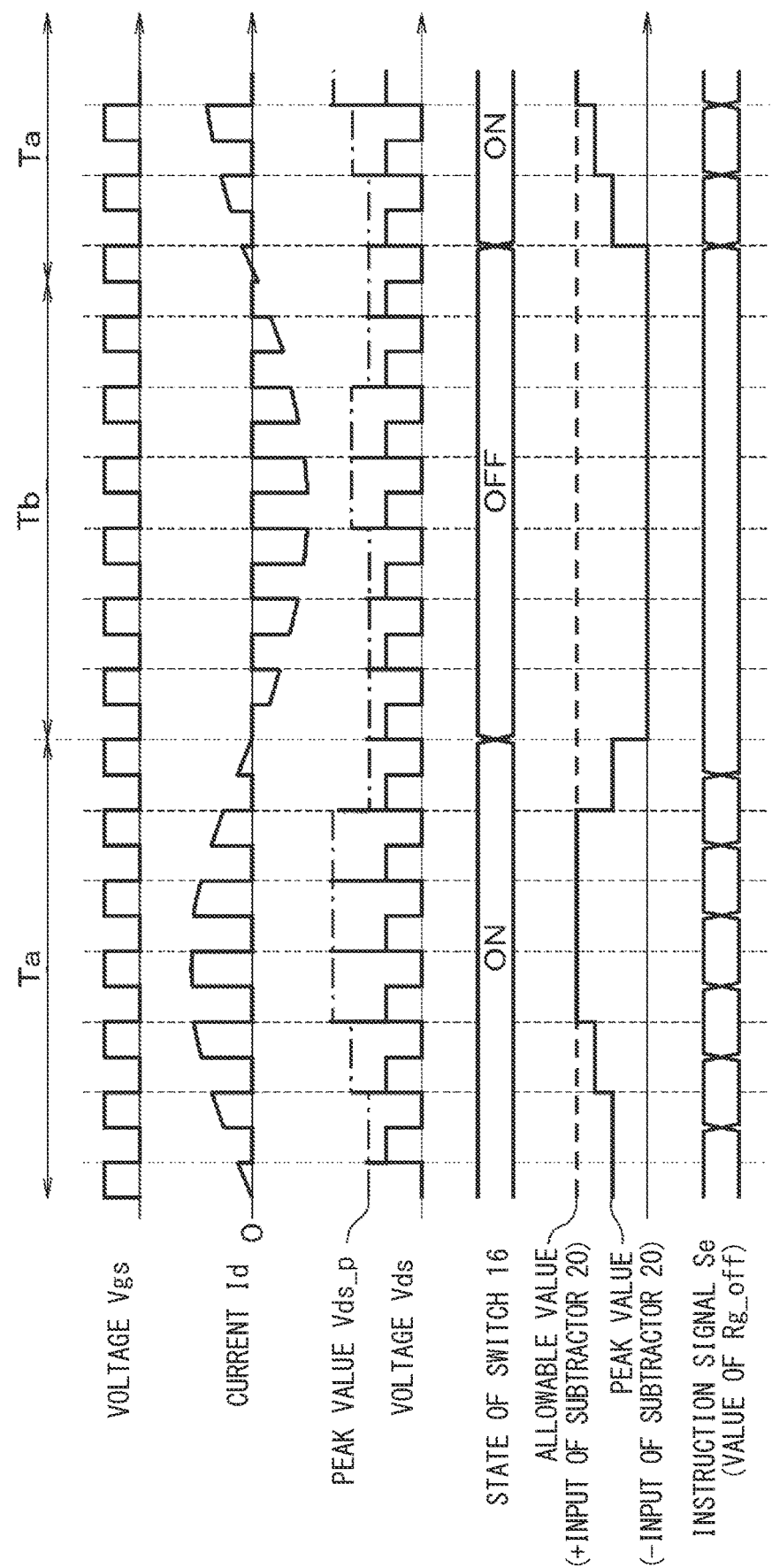
FIG. 7 is a timing chart for explaining a timing of each control through the gate drive device according to the first embodiment.

Next, a timing of each control by the above configuration will be described with reference to FIG. 7. Here, although the control mainly on the gate drive device 1B side will be described as an example, the control mainly on the gate drive device 1A side has the same contents. In FIG. 7, regarding the state of the switch 16, the turned-on state is represented as ON and the turned-off state is represented as OFF. Although FIG. 7 illustrates broken lines extending in a vertical direction so as to coincide with falling timings of the voltage Vgs, and an interval between the broken lines corresponds to a drive cycle of the semiconductor switching element 5.

In this case, when the current Id is a positive value, that is, the period Ta in which the current Id flows in the forward direction is a period in which the energization to the lower element 5B which is the semiconductor switching element 5 of the host arm is the forward energization. Thus, during the period Ta, a turn-off surge occurs. In the period Ta, since the signal SW becomes a high level, the switch 16 is turned on. In such a period Ta, the detection voltage Vb indicating the peak value Vds_p of the voltage Vds is given to the calculation unit 13.

Therefore, the calculation unit 13 calculates and generates the instruction signal Se such that the peak value Vds_p is equal to or less than the permissible value based on the detection voltage Vb and the permissible voltage Vc. Then, the drive unit 14 switches the gate resistance value Rg_off at any time based on the instruction signal Se. In this case, the drive unit 14 completes the change of the gate resistance value Rg_off between the turn-off start time of the predetermined drive cycle and the turn-off start time of the next drive cycle.

On the other hand, when the current Id is a negative value, that is, the period Tb in which the current Id flows in the reverse direction is the period in which the lower element 5B is energized in the reverse direction. Thus, during the period Tb, a recovery surge occurs. In the period Tb, since the signal SW becomes a low level, the switch 16 is turned off. During such a period Tb, the detection voltage Vb is not given to the calculation unit 13. Therefore, the calculation unit 13 does not calculate the instruction signal Se, and the drive unit 14 does not switch the gate resistance value Rg_off.

Therefore, during the period Tb, the gate resistance value Rg_off is maintained at a constant value. The gate resistance value Rg_off in the period Tb can be set to the following value. That is, as illustrated in FIG. 7, the gate resistance value Rg_off in the period Tb can be a value set immediately before the period Tb. Alternatively, the gate resistance value Rg_off in the period Tb can be a predetermined set value. In this case, the set value may be a value indicating a relatively high resistance value that makes it difficult for a surge to occur, that is, a value on the safe side.

In this configuration, the following effects can be obtained. That is, the magnitude of the turn-off surge that first occurs in the period Ta immediately after the period Tb corresponds to the value of the gate resistance value Rg_off in the period Tb. Therefore, when the value of Rg_off in the period Tb is set to the value on the safe side as described above, the turn-off surge that first occurs in the period Ta can be reliably prevented from becoming excessive so as to exceed the element withstand voltage of the semiconductor switching element 5.

According to the present embodiment described above, the following effects are obtained.

The voltage detection unit 11 detects the peak value Vds_p of the voltage Vds during the change period in which the voltage Vds of the semiconductor switching element 5 of the host arm changes. The peak value Vds_p of the voltage Vds during the change period is a value corresponding to the magnitude of the surge applied to the main terminal of the semiconductor switching element 5. Thus, in this case, it can be said that the detection unit 11 detects the magnitude of the surge applied to the main terminal of the semiconductor switching element 5 of the host arm.

The determination unit 12 determines whether the energization to the semiconductor switching element 5 of the host arm during the change period is a forward energization or a reverse energization. The surge applied to the main terminal of the semiconductor switching element 5 includes a turn-off surge and a recovery surge. When the target semiconductor switching element 5 is energized in the forward direction, a turn-off surge is generated and when the target semiconductor switching element 5 is energized in the reverse direction, a recovery surge is generated. Therefore, in this case, it can be said that the determination unit 12 determines whether the generated surge is a turn-off surge or a recovery surge.

The calculation unit 13 calculates the target instruction value corresponding to the switching speed of the semiconductor switching element 5 such that the peak value Vds_p becomes equal to or less than the permissible value based on the detection value detected by the detection unit 11 during the change period in which the determination unit 12 determines that the energization to the semiconductor switching element 5 is the forward energization, and the permissible value of the peak value Vds_p determined according to the specification of the semiconductor switching element 5. That is, the calculation unit 13 calculates the target instruction value such that the peak value Vds_p of the voltage Vds becomes equal to or less than the permissible value based on the detection value corresponding to the magnitude of the surge during the change period in which the generated surge is determined to be a turn-off surge and the permissible value.

The drive unit 14 changes the gate resistance value Rg_off of the semiconductor switching element 5 of the host arm based on the target instruction value calculated by the calculation unit 13, and drives the gate of the semiconductor switching element 5 of the host arm. That is, the drive unit 14 changes the gate resistance value Rg_off based on the target instruction value calculated using the detection result of the surge voltage including only the turn-off surge. According to such a configuration, the magnitude of the turn-off surge can be controlled such that the peak value Vds_p of the voltage Vds does not exceed the permissible value and the switching loss does not increase unnecessarily, in other words, the turn-off surge can be appropriately controlled.

Further, in this case, the drive unit 14 completes the change of the gate resistance value Rg_off by the time the semiconductor switching element 5 of the host arm is turned off next time. That is, in the present embodiment, when the target instruction value is calculated based on the detection value of the peak value Vds_p of the voltage Vds in the predetermined drive cycle, the calculation result is actually reflected in the gate resistance value Rg_off at the time when the semiconductor switching element 5 of the host arm is next turned off. According to such control, the optimization of the gate resistance value Rg_off can be promptly and reliably achieved. In other words, it is possible to attain the maximum effect.

In this case, the determination unit 12 detects the direction of the current Id flowing through the semiconductor switching element 5 of the host arm, determines that the period of the current Id flowing in the forward direction is the forward energization, and determines that the period of the current Id flowing in the reverse direction is the reverse energization. Specifically, the determination unit 12 of the present embodiment includes the comparator 17 that compares the voltage Vse corresponding to the current Id with 0V.

According to such a configuration, since the level of the signal Sd output from the comparator 17 is at a level corresponding to the direction in which the current Id flows during the energization of the host arm which is a period in which the semiconductor switching element 5 of the host arm is turned on, it is possible to accurately determine whether the energization of the semiconductor switching element 5 of the host arm is the forward energization or the reverse energization. However, in this case, since the current Id flowing through the semiconductor switching element 5 of the host arm is necessarily zero during the counter arm energization which is a period in which the semiconductor switching element 5 of the counter arm is turned on, the level of the signal Sd may not be a level corresponding to the direction in which the current Id flows.

Thus, the determination unit 12 includes the sampling hold circuit 18 that samples the signal Sd during the energization of the host arm and holds and complements the sampling result during the energization of the counter arm, and determines the energization based on the level of the signal SW output from the sampling hold circuit 18. According to such a configuration, it is possible to reliably determine the direction of the current Id, and eventually, it is possible to reliably determine whether the energization of the semiconductor switching element 5 of the host arm is the forward energization or the reverse energization.

In this case, the calculation unit 13 calculates the instruction signal Se indicating the target instruction value such that the deviation ΔV between the detection voltage Vb indicating the detection value by the detection unit 11 and the permissible voltage Vc indicating the permissible value of the peak value Vds_p becomes zero, and the drive unit 14 continuously switches the gate resistance value Rg_off of the semiconductor switching element 5 of the host arm based on the instruction signal Se. According to such a configuration, the gate resistance value Rg_off at the time of turn-off of the semiconductor switching element 5 of the host arm can be set in detail so as to be a more optimum value, and as a result, the turn-off surge can be controlled in more detail.

<Modification regarding Detection of Current Id>

In the specific configuration example illustrated in FIG. 6, although the determination unit 12 is configured to directly detect the current Id of the semiconductor switching element 5 of the host arm based on the terminal voltage of the shunt resistor Rs interposed in series between the semiconductor switching element 5 and the DC power supply line 3, the determination unit 12 may be configured to indirectly detect the current Id of the semiconductor switching element 5 of the host arm as in the following two modification.

(First Modification)

Figure 8:
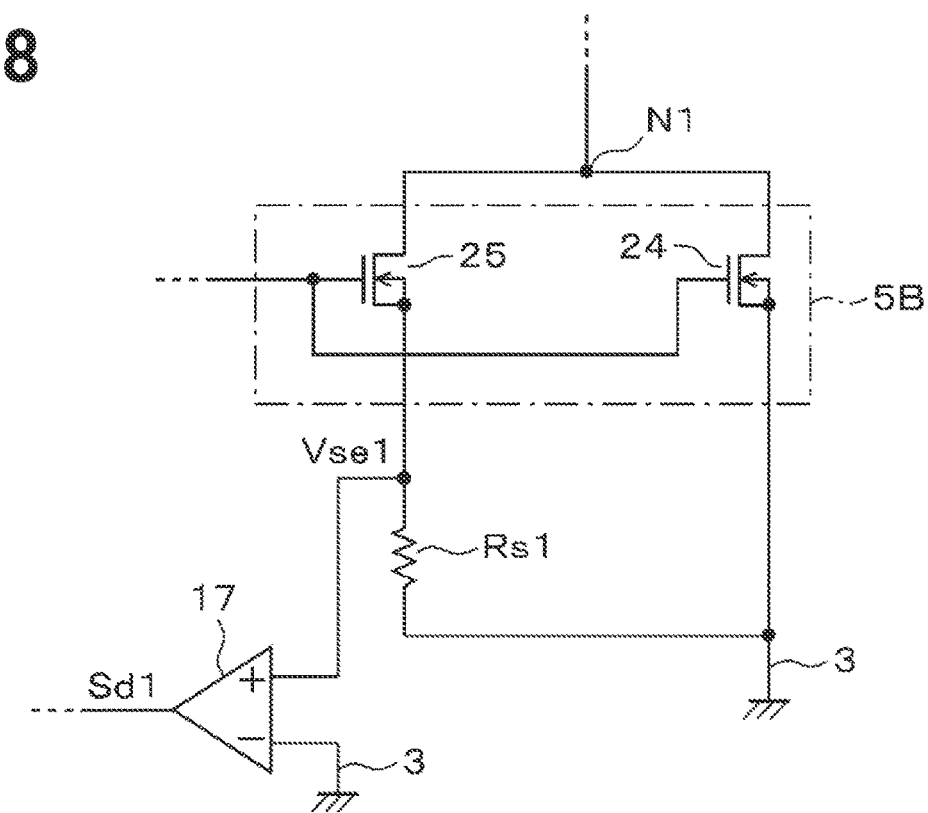
FIG. 8 is a diagram illustrating a first modification related to detection of the drain current.

In a first modification illustrated in FIG. 8, an element including a main cell 24 and a sense cell 25 is adopted as the lower element 5B which is the semiconductor switching element 5 of the host arm. In FIG. 8, the illustration of the reflux diode is omitted. The main cell 24 and the sense cell 25 are formed on the same semiconductor chip, and a size of the sense cell 25 is several hundred to several 1/1000 with respect to a size of the main cell 24.

A drain of the main cell 24 is connected to the node N1, and a source thereof is connected to the DC power supply line 3. The sense cell 25 is for detecting a current Id flowing through the main cell 24, and a current corresponding to the current Id flowing through the main cell 24 flows at a predetermined dividing ratio. The shunt ratio is determined by a size ratio of the main cell 24 and the sense cell 25, and the like. The drain of the sense cell 25 is connected to the node N1, and the source thereof is connected to the DC power supply line 3 via a shunt resistor Rs1.

In this case, the comparator 17 compares a voltage Vse1 obtained by voltage conversion of the current flowing through the sense cell 25 by the shunt resistor Rs1 with 0 V, and outputs a binary signal Sd1 indicating the comparison result. Similar to the signal Sd in the configuration illustrated in FIG. 6, such a signal Sd1 is at a level corresponding to the direction of the current Id during the energization of the host arm. Accordingly, according to such a first modification as well, the determination unit 12 can accurately determine whether the energization to the semiconductor switching element 5 of the host arm during the change period is the forward energization or the reverse energization.

(Second Modification)

As illustrated in FIG. 1, the detection signal Sc indicating the detection value of the load current IL is given to the controller 6. The controller 6 can grasp the direction of the load current IL based on the detection signal Sc, specifically, the controller 6 can determines whether the load current IL flows from the node N1 to the motor or from the motor to the node N1. Then, based on the direction of the load current IL, it is possible to estimate the direction of the current Id flowing through each of the semiconductor switching elements 5 constituting the upper and lower arms.

Figure 9:
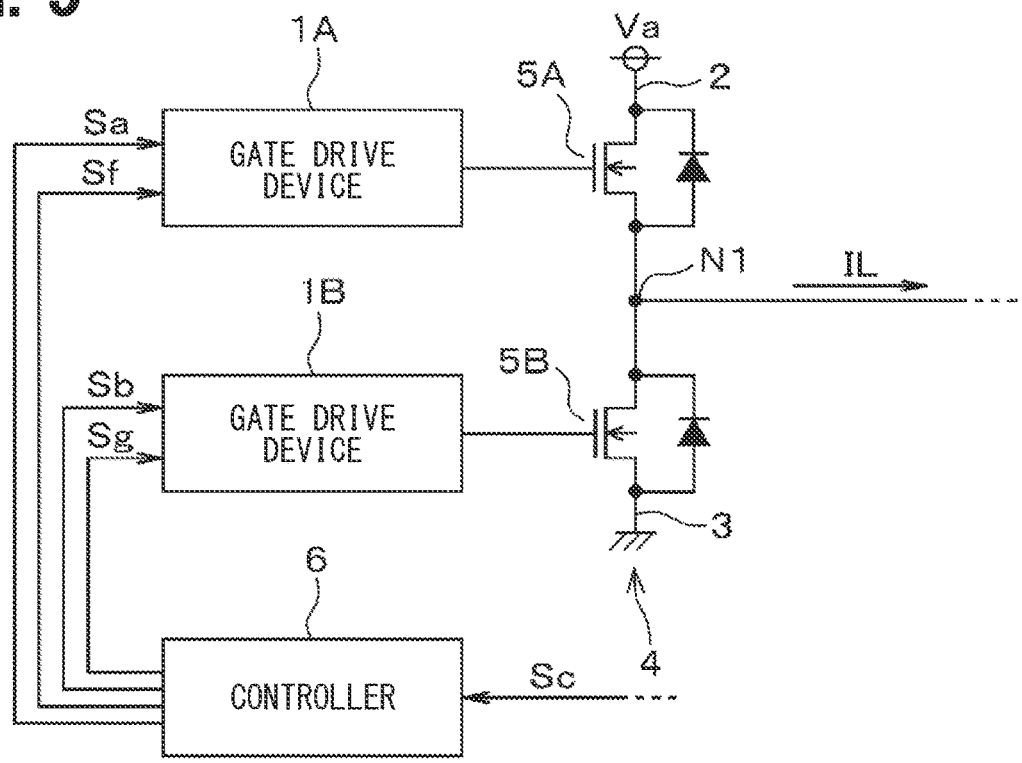
FIG. 9 is a diagram illustrating a second modification related to detection of the drain current.

Therefore, in the second modification illustrated in FIG. 9, the controller 6 estimates the direction of the current Id flowing through the upper element 5A and the direction of the current Id flowing through the lower element 5B based on the detection signal Sc. Then, the controller 6 transmits a signal Sf indicating the direction of the current Id flowing through the upper element 5A to the gate drive device 1A, and transmits a signal Sg indicating the direction of the current Id flowing through the lower element 5B to the gate drive device 1B.

In this case, the signals Sf and Sg are binary signals each having a level corresponding to the direction of the current Id, similarly to the signal SW. Therefore, each of the determination units 12 of the gate drive devices 1A and 1B determines the direction of the current Id flowing through the semiconductor switching element 5 of the host arm based on these signals Sf and Sg. Accordingly, according to such a second modification as well, the determination unit 12 can accurately determine whether the energization to the semiconductor switching element 5 of the host arm during the change period is the forward energization or the reverse energization.

Second Embodiment

Hereinafter, a second embodiment will be described with reference to FIG. 10 to FIG. 13.

Figure 10:
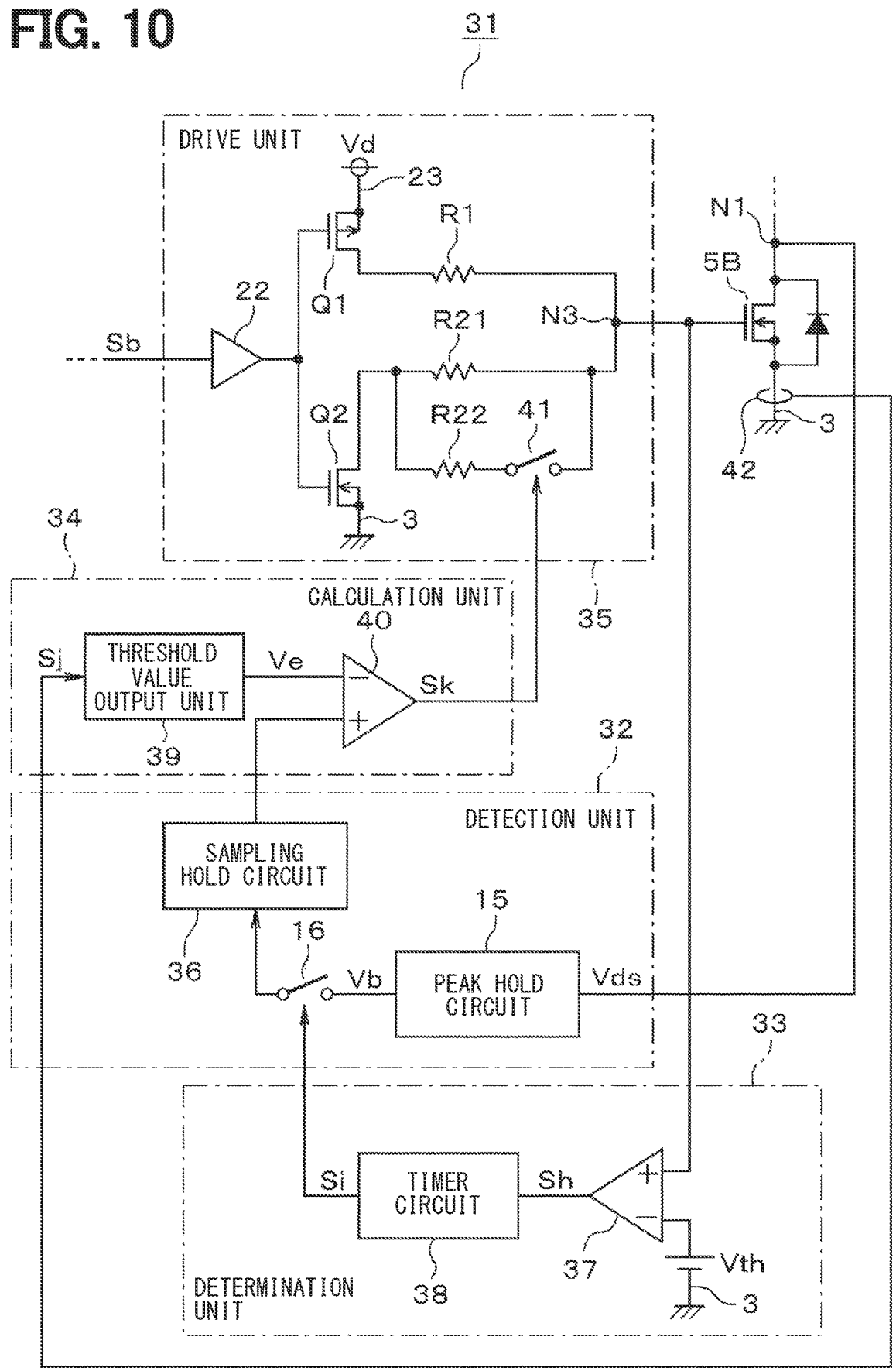
FIG. 10 is a diagram schematically showing a specific configuration example of the gate drive device according to a second embodiment.

The present embodiment is different from the first embodiment in the configuration of the gate drive apparatus. That is, as illustrated in FIG. 10, a gate drive device 31 of the present embodiment has a detection unit, a determination unit, a calculation unit, and a driving unit each of which has a specific configuration changed with respect to the gate drive device 1B of the first embodiment illustrated in FIG. 6. In FIG. 10, although a configuration for driving the lower element 5B is illustrated, the same configuration can be adopted for a configuration for driving an upper element 5A.

The gate drive device 31 includes a detection unit 32, a determination unit 33, a calculation unit 34, and a drive unit 35. The detection unit 32 has a configuration in which a sampling hold circuit 36 is added to the detection unit 11. The determination unit 33 is configured to include a comparator 37 and a timer circuit 38. The calculation unit 34 is configured to include a threshold value output unit 39 and a comparator 40. The drive unit 35 is different from the drive unit 14 in that the resistors R21, R22 and the switch 41 are provided instead of the resistor R2.

In this case, the determination unit 33 determines that the lower element 5B is energized in the forward direction in a period before a point in time when a predetermined determination time has elapsed from a timing at which the lower element 5B, which is a semiconductor switching element 5 of the host arm, starts to be turned off. The determination unit 33 determines that the lower element 5B is energized in the reverse direction in a period after a point in time when the predetermined determination time has elapsed. A specific configuration for implementing such a determination is as follows.

That is, a non-inverting input terminal of the comparator 37 is connected to a node N3, that is, a gate of the lower element 5B. A predetermined threshold voltage Vth is input to an inverting input terminal of the comparator 37. The threshold voltage Vth is a voltage based on a potential of a DC power supply line 3, and is, for example, a voltage value equivalent to a gate threshold voltage of the semiconductor switching element 5. As a result, the comparator 37 compares a voltage Vgs of the lower element 5B with the voltage Vth, and outputs a binary signal Sh indicating the comparison result.

According to the above configuration, the on and off of the lower element 5B can be determined based on a level of the signal Sh output from the comparator 37. Specifically, it can be determined that the lower element 5B is turned on, that is, the gate is turned on when the signal Sh is at a high level, and the lower element 5B is turned off, that is, the gate is turned off when the signal Sh is at a low level. As described above, a timing at which the lower element 5B starts to be turned off can be grasped based on the signal Sh at the level corresponding to a state where the gate is turned on or the gate is turned off. Instead of such a configuration, it is also possible to have a configuration in which the timing at which the lower element 5B starts to be turned off is grasped based on another signal such as an instruction signal Sb.

The signal Sh output from the comparator 37 is input to the timer circuit 38. The timer circuit 38 outputs a binary signal Si that is at a high level for a certain time corresponding to the above-described determination period from a timing at which the signal Sh changes from a high level to a low level, that is, a timing at which the lower element 5B starts to be turned off. In this case, the on and off of the switch 16 is controlled by the signal Si output from the timer circuit 38.

According to the above configuration, during the period when the signal Si is at a high level, that is, the period before the point in time when the determination time has elapsed from a timing at which the lower element 5B starts to be turned off, the switch 16 is turned on and the detection voltage Vb is input to the sampling hold circuit 36. On the other hand, during the period when the signal Si is at a low level, that is, the period after the determination time has elapsed from a timing at which the lower element 5B starts to be turned off, the switch 16 is turned off and the detection voltage Vb is not input to the sampling hold circuit 36.

The detection voltage Vb input to the sampling hold circuit 36 indicates the detection value of the peak value Vds_p in occurrence of a turn-off surge when the lower element 5B is energized in the forward direction. The detection voltage Vb input to the sampling hold circuit 36 does not indicate the detection value of the peak value Vds_p in occurrence of a turn-off surge when the lower element 5B is energized in the reverse direction, but becomes almost 0 V. Therefore, when the input detection voltage Vb is equal to or less than a predetermined determination voltage set to a value higher than 0V, the sampling hold circuit 36 determines that the detection voltage Vb is the detection voltage Vb when energized in the reverse direction, and does not hold the detection voltage Vb as a sample.

On the other hand, when the input detection voltage Vb exceeds the above determination voltage, the sampling hold circuit 36 determines that the detection voltage Vb is the detection voltage Vb when energized in the forward direction, holds the detection voltage Vb as a sample, and then, outputs to the calculation unit 34. According to the above configuration, the detection voltage Vb indicating the detection value of the peak value Vds_p when the lower element 5B is energized in the forward direction, in other words, when a turn-off surge is occurring is input to the calculation unit 34.

In this case, the calculation unit 34 compares the value detected by the detection unit 32 with the threshold value set corresponding to the permissible value of the peak value Vds_p of the voltage Vds, and calculates the value indicating the comparison result as the target instruction value. A specific configuration for implementing such a calculation is as follows. That is, a detection signal Sj corresponding to the detection value by the current detection unit 42 that detects the current Id of the lower element 5B is input to the threshold value output unit 39. The current detection unit 42 can adopt various configurations such as a configuration using the shunt resistor Rs illustrated in FIG. 6 and a configuration using the sense cell 25 and the shunt resistor Rs1 illustrated in FIG. 8.

Figure 11:
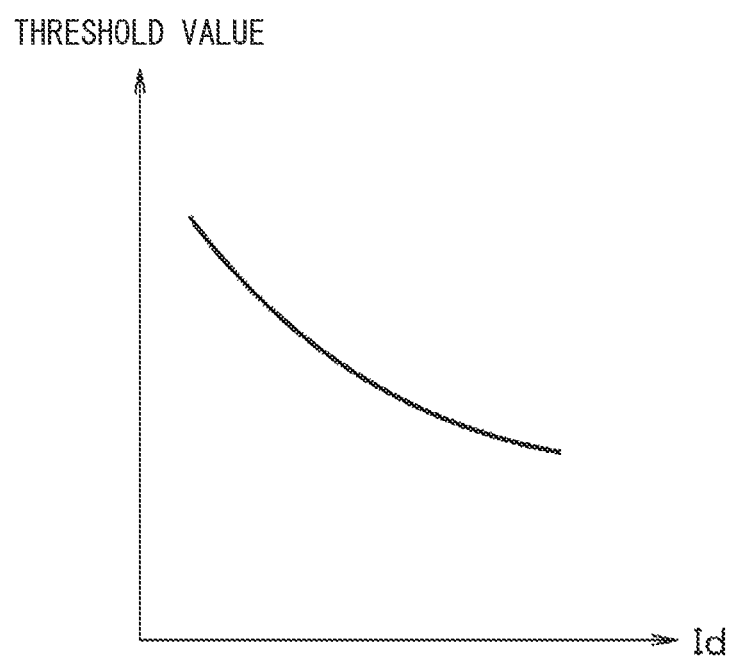
FIG. 11 is a diagram schematically illustrating a relationship between a threshold value and a drain current according to the second embodiment.

The threshold value output unit 39 includes a storage device such as a memory, and map data created based on a relationship between the threshold value and the current Id flowing through the semiconductor switching element 5 is stored in the memory. The relationship between the threshold value and the current Id is, for example, as illustrated in FIG. 11. Such map data can be generated in advance based on results of simulation, experiment, and the like performed in advance. The threshold value is set to a value that allows the magnitude of the turn-off surge to be controlled to a desired degree.

The threshold value output unit 39 acquires the current value of the current Id based on the detection signal Sj, refers to the map data, acquires the threshold value corresponding to the current value of the current Id from the map data, and outputs a threshold voltage Ve corresponding to the acquired threshold value. The threshold voltage Ve output from the threshold value output unit 39 is input to the inverting input terminal of the comparator 40, and the detection voltage Vb output from the sampling hold circuit 36 is input to the non-inverting input terminal thereof.

The comparator 40 compares the threshold voltage Ve and the detection voltage Vb, and outputs a binary signal Sk indicating the comparison result to the drive unit 35. That is, in this case, the signal Sk indicates a value for instructing the gate resistance value of the lower element 5B, and is a signal indicating a target instruction value corresponding to the switching speed of the semiconductor switching element 5. The signal Sk is at a high level when the detection voltage Vb is higher than the threshold voltage Ve, that is, when the detection value of the voltage Vds_p when the turn-off surge occurs is higher than the threshold value. Further, the signal Sk is at a low level when the detection voltage Vb is smaller than the threshold voltage Ve, that is, when the detection value of the voltage Vds_p when the turn-off surge occurs is smaller than the threshold value. The comparator 40 may have a hysteresis in detection and recovery. However, in this case, it is necessary to input two threshold values to the comparator 40.

In this case, the drive unit 35 is adapted to stepwise switch the gate resistance value Rg_off of the lower element 5B, which is the semiconductor switching element 5 of the host arm, based on the signal Sk corresponding to the target instruction value. The specific configuration for realizing such switching of the gate resistance value Rg_off is as follows. That is, in the drive unit 35, the drain of the transistor Q2 is connected to the node N3 via the resistor R21, and is connected to the node N3 via the resistor R22 and the switch 41.

Both of the resistors R21 and R22 have a constant resistance value, and, together with the wiring resistance of the path from the DC power supply line 3 to the gate of the lower element 5B, function as a gate resistor when the lower element 5B is turned off. In other words, the drive unit 35 has a configuration in which two resistors R21 and R22 functioning as a gate resistor during turn-off are connected in parallel between the DC power supply line 3 and the node N3. On and off of the switch 41 is controlled by the signal Sk output from the calculation unit 34. Specifically, the switch 41 is turned off when the signal Sk is at a high level and turned on when the signal Sk is at a low level.

According to the above configuration, the switch 41 is turned off when the detection value of the voltage Vds_p when the turn-off surge occurs is greater than the threshold value, so that the gate resistance value Rg_off at the time of turn-off becomes a value corresponding to the resistance value of the resistor R21 value, that is, a relatively large value, and the turn-off surge is suppressed. Further, according to the above configuration, when the detection value of the voltage Vds_p when the turn-off surge occurs is smaller than the threshold value, the switch 41 is turned on, so that the gate resistance value Rg_off at the time of turn-off is a value corresponding to the parallel combined resistance value of the resistors R21 and R22, that is, a relatively small value, and high-speed switching is realized.

Figure 12:
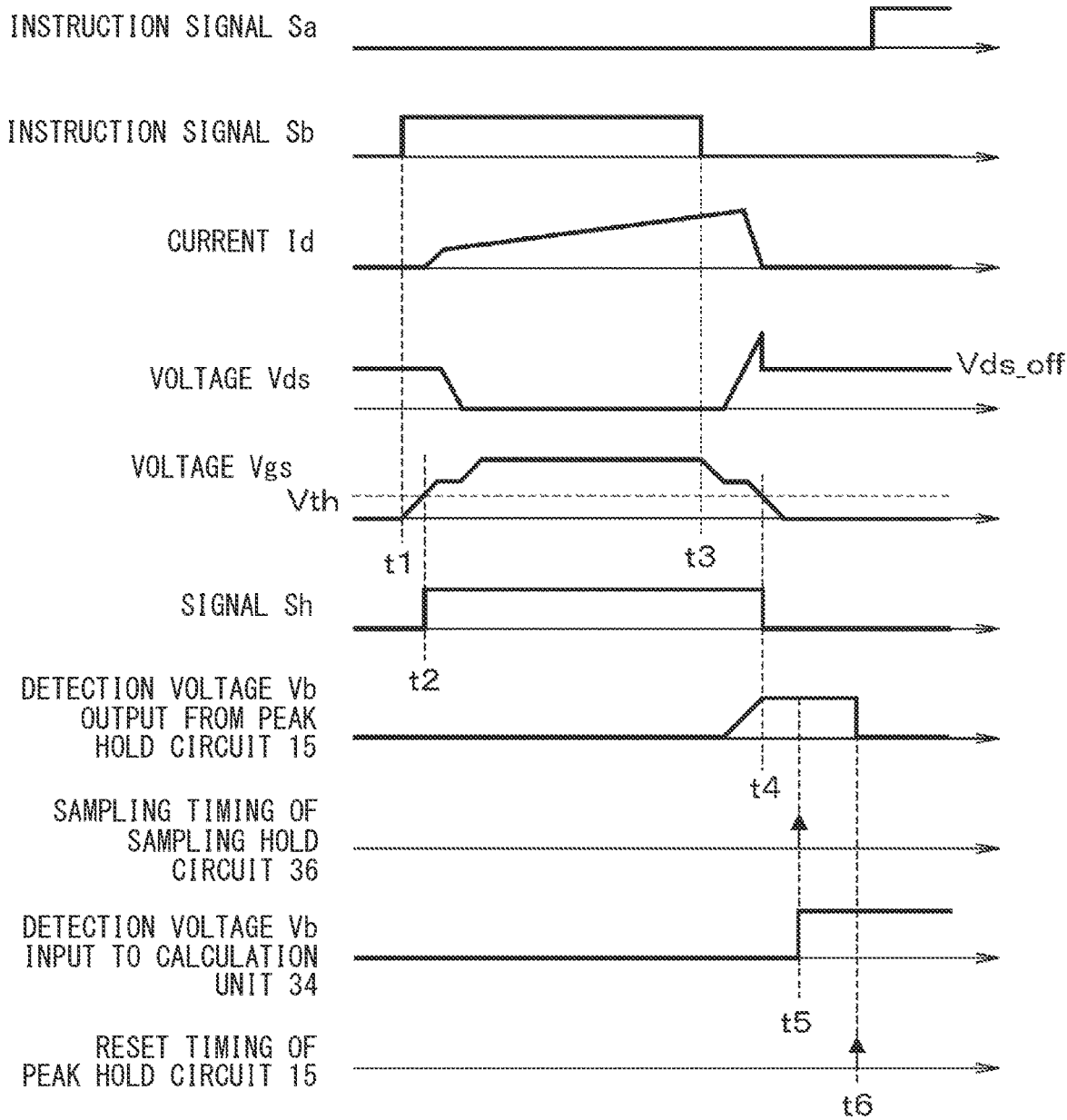
FIG. 12 is a timing chart for describing a timing of each control by the gate drive device during forward energization according to the second embodiment.
Figure 13:
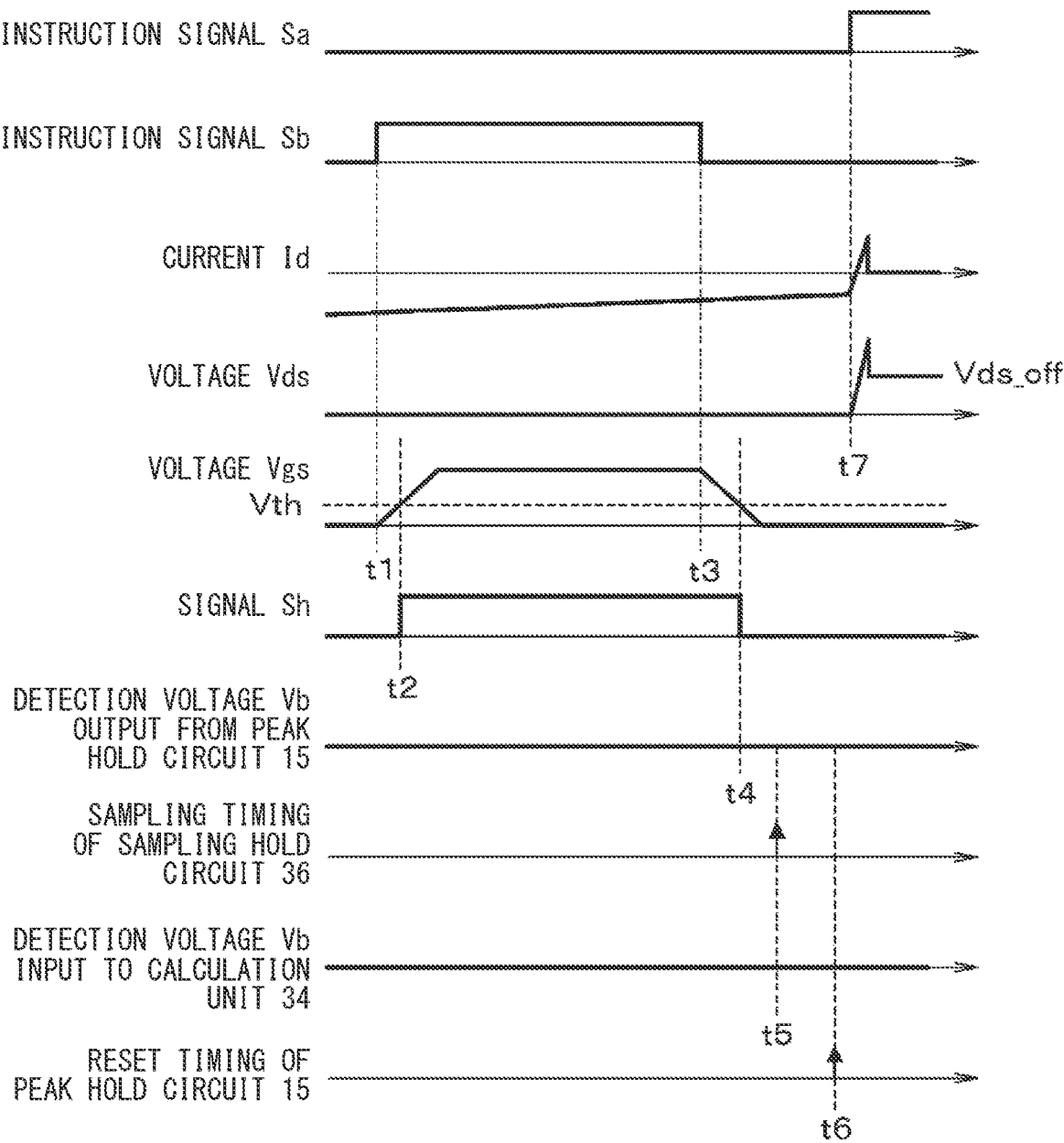
FIG. 13 is a timing chart for describing a timing of each control by the gate drive device during reverse energization according to the second embodiment.

Next, a timing of each control with the above configuration will be described with reference to FIGS. 12 and 13. Here, although the control mainly on the gate drive device 31 side for driving the lower element 5B will be described as an example, the control mainly on the gate drive device side for driving the upper element 5A has the same contents. In FIGS. 12 and 13, instruction signals Sa and Sb are represented as binary signals that give an instruction to turn on a high level and give an instruction to turn off a low level.

First, a timing of each control when the energization to the lower element 5B which is the semiconductor switching element 5 of the host arm is the forward energization will be described with reference to FIG. 12. In this case, when the instruction signal Sb changes from a low level to a high level at time t1, the voltage Vgs starts to increase. In this case, as the voltage Vgs increases, the current Id increases and the voltage Vds decreases. When the voltage Vgs reaches the threshold voltage Vth at time t2, the signal Sh changes from a low level to a high level.

Thereafter, when the instruction signal Sb changes from a high level to a low level at time t3, the voltage Vgs starts to decrease. When the voltage Vgs reaches the threshold voltage Vth at time t4, the signal Sh changes from a high level to a low level. Although not illustrated, the signal Si is at a high level from time t4 until the determination time elapses. In this case, since the energization to the lower element 5B is the forward energization, the surge occurs immediately after time t3 which is a timing at which the lower element 5B starts to be turned off, and the voltage Vds sharply increases beyond an off-voltage Vds_off.

Thus, the detection voltage Vb higher than 0 V is input to the sampling hold circuit 36. Therefore, the sampling hold circuit 36 samples the detection voltage Vb at time t5 when a predetermined time has elapsed from time t4. As a result, the detection voltage Vb indicating the detection value of the peak value Vds_p when the turn-off surge is occurring is input to the calculation unit 34. The calculation unit 34 generates the signal Sk by using such a detection voltage Vb. Then, the drive unit 35 switches the gate resistance value Rg_off based on the signal Sk given from the calculation unit 34. In this case, the output of the peak hold circuit 15 is also reset at time t6 when a predetermined time has elapsed from time t5.

Subsequently, a timing of each control when the energization to the lower element 5B which is the semiconductor switching element 5 of the host arm is the reverse energization will be described with reference to FIG. 13. In this case, when the instruction signal Sb changes from a low level to a high level at time t1, the voltage Vgs also starts to increase. However, in this case, since the lower element 5B performs a reflux operation, the current Id and the voltage Vds do not greatly change, and the voltage Vds is maintained at 0 V. When the voltage Vgs reaches the threshold voltage Vth at time t2, the signal Sh changes from a low level to a high level.

Thereafter, when the instruction signal Sb changes from a high level to a low level at time t3, the voltage Vgs starts to decrease. When the voltage Vgs reaches the threshold voltage Vth at time t4, the signal Sh changes from a high level to a low level. Although not illustrated, the signal Si is at a high level from time t4 until the determination time elapses. In this case, since the energization to the lower element 5B is the reverse energization, the surge does not occur immediately after time t3 which is a timing at which the lower element 5B starts to be turned off, and the voltage Vds is maintained at 0 V.

Thus, the detection voltage Vb of 0 V is input to the sampling hold circuit 36. Therefore, the sampling hold circuit 36 does not sample and hold the detection voltage Vb, and since the detection voltage Vb is not input to the calculation unit 34, the signal Sk is not generated. Therefore, the drive unit 35 does not switch the gate resistance value Rg_off. In this case, the output of the peak hold circuit 15 is also reset at time t6 when a predetermined time has elapsed from time t5. In this case, the recovery surge occurs immediately after time t7 when the instruction signal Sa changes from a low level to a high level, that is, time t7 which is a timing at which the upper element 5A which is the semiconductor switching element 5 of the counter arm starts to be turned on, and the voltage Vds rapidly increases beyond the off-voltage Vds_off.

Also in the configuration of the present embodiment described above, similarly to the first embodiment, the gate resistance value Rg_off is changed based on the target instruction value calculated by using the detection result of the surge voltage including only the turn-off surge. Therefore, the similar effect to that of the first embodiment, that is, the turn-off surge can be appropriately controlled. In this embodiment, paying attention to the following points, it is possible to calculate the target instruction value using the surge voltage including only the turn-off surge.

That is, when the energization of the semiconductor switching element 5 of the host arm is the forward energization, the turn-off surge occurs immediately after the gate of the semiconductor switching element 5 is turned off. Therefore, the detection voltage Vb corresponding to the detection value of the peak value Vds_p after a predetermined time from the turn-off start timing of the semiconductor switching element 5 of the host arm is sampled and held, and output to the calculation unit 34. With this configuration, the calculation unit 34 can calculate the target instruction value using the detection value Vb indicating the detection result of the surge voltage including only the turn-off surge. In this embodiment, by adopting the configuration as described above, it is possible to calculate such a target instruction value.

In this case, the calculation unit 34 compares the detection value Vb indicating the detection value by the detection unit 11 with the threshold value set corresponding to the permissible value of the peak value Vds_p of the voltage Vds, and calculates the target instruction value indicating the comparison result. The drive unit 35 is adapted to stepwise switch the gate resistance value Rg_off of the semiconductor switching element 5 of the host arm based on the signal Sk corresponding to the target instruction value. The configuration and control can be simplified.

<Modification Regarding Switching of Gate Resistance Value>

In the specific configuration example illustrated in FIG. 10, the drive unit 35 is configured to switch the gate resistance value Rg_off of the semiconductor switching element 5 of the host arm in two stages based on the signal Sk corresponding to the target instruction value. Alternatively, the drive unit 35 may be configured to switch the gate resistance value Rg_off in three or more stages based on the signal Sk. When adopting such a configuration, the calculation unit 34 compares the detection voltage Vb with multiple threshold values, and calculates a value indicating the comparison result as the target instruction value. Therefore, when such a configuration is adopted, the number of map data stored in advance, the number of comparators, and the number of switches for switching the gate resistance value Rg_off increase.

Third Embodiment

Figure 14:
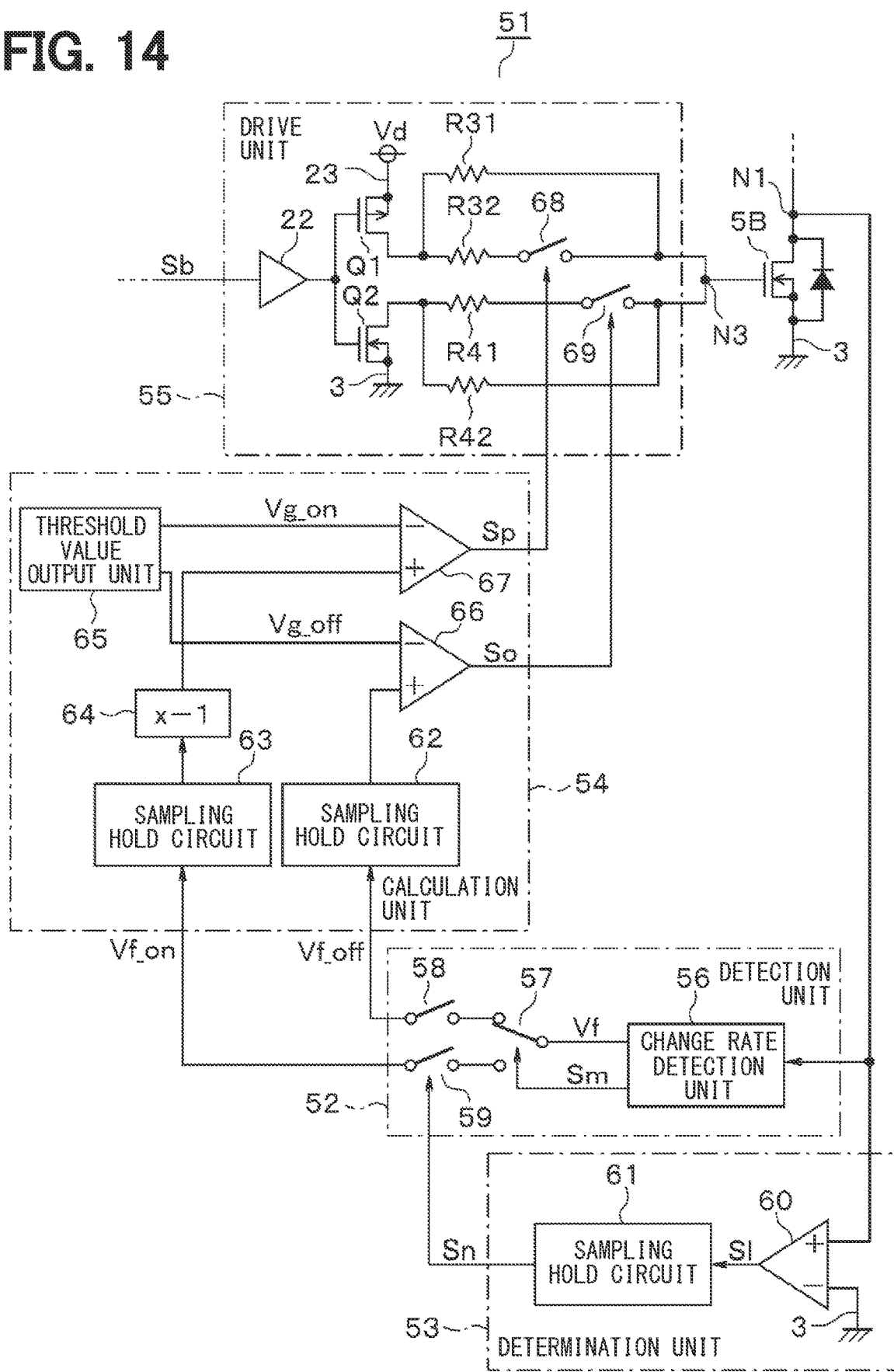
FIG. 14 is a diagram schematically showing a specific configuration example of the gate drive device according to a third embodiment.

Hereinafter, a third embodiment will be described with reference to FIG. 14.

The present embodiment is different from the first embodiment in the configuration of the gate drive apparatus. That is, as illustrated in FIG. 14, a gate drive device 51 of the present embodiment has a detection unit, a determination unit, a calculation unit, and a driving unit each of which has a specific configuration changed with respect to the gate drive device 1B of the first embodiment illustrated in FIG. 6. In FIG. 14, although a configuration for driving the lower element 5B is illustrated, the same configuration can be adopted for a configuration for driving an upper element 5A.

The gate drive device 51 includes a detection unit 52, a determination unit 53, a calculation unit 54, and a drive unit 55. The detection unit 52 is configured to include a change rate detection unit 56, a switching unit 57, and switches 58 and 59. The determination unit 53 has a configuration including a comparator 60 and a sampling hold circuit 61. The calculation unit 54 is configured to include sampling hold circuits 62 and 63, a polarity inverting unit 64, a threshold value output unit 65, and comparators 66 and 67. The drive unit 55 is different from the drive unit 14 in that resistors R31 and R32 and switch 68 are provided instead of the resistor R1, and resistors R41 and R42 and switch 69 are provided instead of the resistor R2.

In this case, the detection unit 52 detects the change rate of the voltage Vds, that is, dV/dt during a change period in which the voltage Vds of the lower element 5B that is the semiconductor switching element 5 of the host arm changes. A specific configuration for implementing such a detection is as follows. That is, the voltage of the node N1, that is, the drain voltage of the lower element 5B is input to the change rate detection unit 56. The change rate detection unit 56 receives the drain voltage of the lower element 5B with respect to the source potential of the lower element 5B, that is, the voltage Vds, and detects its dV/dt.

The change rate detection unit 56 outputs a detection voltage Vf indicating the detection value of dV/dt. The change rate detection unit 56 outputs a binary signal Sm that is at a high level when the detection value of dV/dt is a positive value, and is at a low level when the detection value of dV/dt is 0 V or a negative value. An input terminal of the switching unit 57 is supplied with a detection voltage Vf. Based on the level of the signal Sm output from the change rate detection unit 56, the switching unit 57 switches between one output terminal and the other output terminal to output the input detection voltage Vf. Specifically, the switching unit 57 outputs the detection voltage Vf input from one output terminal when the signal Sm is at a high level, and outputs the detection voltage Vf input from the other output terminal when the signal Sm is at a low level.

According to such a configuration, since the detection value of dV/dt becomes a positive value when the lower element 5B is turned off, the detection voltage Vf is output from one output terminal of the switching unit 57, and since the detection value of dV/dt becomes a negative value when the lower element 5B is turned on, the detection voltage Vf is output from the other output terminal of the switching unit 57. That is, the detection voltage Vf output from one output terminal of the switching unit 57 indicates dV/dt when the lower element 5B is turned off, and is supplied to the subsequent calculation unit 54 via the switch 58. The detection voltage Vf output from the other output terminal of the switching unit 57 indicates dV/dt when the lower element 5B is turned on, and is supplied to the subsequent calculation unit 54 via the switch 59. The on/off states of the switches 58 and 59 are similarly controlled by the signal Sn output from the determination unit 53.

When a voltage Vds during an on-period in which a lower element 5B is turned on is a positive voltage value, it is considered that the energization to the lower element 5B is forward energization. When the voltage Vds during the on-period in which the lower element 5B is turned on is a negative voltage value, it is considered that the energization to the lower element 5B is reverse energization. Therefore, the determination unit 53 detects the voltage Vds during the on-period when the lower element 5B is turned on, determines that the energization to the lower element 5B is forward energization during the period when the detection value of the voltage Vds is a positive value, and determines that the energization to the lower element 5B is reverse energization when the detection value of the voltage Vds is a negative value. A specific configuration for implementing such a determination is as follows.

That is, the non-inverting input terminal of the comparator 60 is connected to the node N1, and the inverting input terminal thereof is connected to the DC power supply line 3. That is, the non-inverting input terminal of the comparator 60 receives the drain voltage of the lower element 5B, and the inverting input terminal thereof receives the source voltage of the lower element 5B. According to such a configuration, the binary signal Sl output from the comparator 60 becomes high level when the voltage Vds is a positive value, that is, when Vds>0, and becomes low level when the voltage Vds is a negative value, that is, when Vds<0.

The signal Sl output from the comparator 60 is input to the sampling hold circuit 61. The sampling hold circuit 61 samples the signal Sl at arbitrary timing while the lower element 5B is on. The period during which the lower element 5B is on can be grasped based on the voltage Vgs, the instruction signal Sb, and the like, as described in the second embodiment. The sampling hold circuit 61 outputs a binary signal Sm obtained by sampling and holding the signal Sl.

According to the above configuration, when the lower element 5B is energized in the forward direction, the signal Sn becomes high level, so that the switches 58 and 59 are turned on and the detection voltage Vf is input to the calculation unit 54. On the other hand, when the lower element 5B is energized in the reverse direction, the signal Sn becomes low level, so the switches 58 and 59 are turned off and the detection voltage Vf is not input to the calculation unit 54. That is, in the above configuration, the calculation unit 54 is provided with a detection voltage Vf indicating each detection value of dV/dt at turn-on and turn-off during a period in which the lower element 5B is energized in the forward direction. In the following description and FIG. 14, the detection voltage Vf indicating the detection value of dV/dt at turn-off will be referred to as a detection voltage Vf_off, and the detection voltage indicating the detection value of dV/dt at turn-on will be referred to as a detection voltage Vf_on.

In this case, the calculation unit 54 calculates the target instruction value such that the detection value of the dV/dt becomes equal to or less than the permissible value based on the detection value of dV/dt detected by the detection unit 52 during the change period in which the determination unit 53 determines that the energization to the lower element 5B is the forward energization and the permissible value of dV/dt. The permissible value of dV/dt is determined according to the specification of the semiconductor switching element 5, like the permissible value of the peak value of the voltage Vds. The target instruction value in this case also becomes a value for instructing the gate resistance value of the semiconductor switching element 5, as in each of the above-described embodiments. However, the target instruction value in this case includes not only the value for instructing the gate resistance value Rg_off at turn-off, but also the value for instructing the gate resistance value Rg_on at turn-on.

A specific configuration for implementing such a calculation is as follows. That is, the sampling hold circuit 62 receives the detection voltage Vf_off, and the sampling hold circuit 63 receives the detection voltage Vf_on. The sampling hold circuit 62 samples and holds the input detection voltage Vf_off and outputs it to the non-inverting input terminal of the comparator 66. The sampling hold circuit 63 samples and holds the input detection voltage Vf_on and outputs it to the non-inverting input terminal of the comparator 67. However, since the detection voltage Vf_on is a negative voltage value, the detection voltage Vf_on is input to the comparator 67 after the polarity is reversed by the polarity reversing unit 64.

The threshold value output unit 65 has the similar configuration to the threshold value output unit 39 in the second embodiment, and includes a storage device such as a memory storing map data. In this case, the threshold value includes an off threshold value corresponding to gate resistance Rg_off and an on threshold value corresponding to gate resistance Rg_on. Note that the off threshold value and the on threshold value can be set to different values, or can be set to a common value. Although not illustrated, the threshold value output unit 65 is configured to acquire the current value of the current Id, like the threshold value output unit 39.

The threshold value output unit 65 acquires the current value of the current Id, refers to the map data, acquires the threshold value corresponding to the current value of the current Id from the map data, and outputs a threshold voltage corresponding to the acquired threshold value. In this case, the threshold value output unit 65 has two threshold voltages, specifically, a threshold voltage Vg_off corresponding to the off threshold value and a threshold voltage Vg_on corresponding to the on threshold value.

A threshold voltage Vg_off output from the threshold value output unit 65 is input to the inverting input terminal of the comparator 66. The comparator 66 compares the threshold voltage Vg_off with the detection voltage Vf_off, and outputs a binary signal So indicating the comparison result to the drive unit 55. That is, in this case, the signal So indicates a value for instructing the gate resistance value Rg_off of the lower element 5B, and is a signal indicating a target instruction value corresponding to the switching speed of the semiconductor switching element 5.

The signal So becomes high level when the detection voltage Vf_off is greater than the threshold voltage Vg_off, that is, when the detection value of dV/dt at the time of the forward conduction and turn-off is greater than the permissible value. The signal So becomes low level when the detection voltage Vf_off is lower than the threshold voltage Vg_off, that is, when the detection value of dV/dt at the time of the forward conduction and turn-off is lower than the permissible value.

A threshold voltage Vg_on output from the threshold value output unit 65 is input to the inverting input terminal of the comparator 67. The comparator 67 compares the threshold voltage Vg_on with the detection voltage Vf_on after the polarity is inversed, and outputs a binary signal Sp indicating the comparison result to the drive unit 55. That is, in this case, the signal Sp indicates a value for instructing the gate resistance value Rg_on of the lower element 5B, and is a signal indicating a target instruction value corresponding to the switching speed of the semiconductor switching element 5.

The signal Sp becomes high level when the detection voltage Vf_on after the polarity is inversed is greater than the threshold voltage Vg_on, that is, when the detection value of dV/dt at the time of the forward conduction and turn-on is greater than the permissible value. The signal Sp becomes low level when the detection voltage Vf_on after the polarity is inversed is smaller than the threshold voltage Vg_on, that is, when the detection value of dV/dt at the time of the forward conduction and turn-on is smaller than the permissible value. In this case, the detection voltage Vf_on in which the polarity is inversed is input to the comparator 67. Alternatively, the detection voltage Vg_on in which the polarity is inversed is input to the comparator 67.

In this case, the drive unit 55 stepwise switches the gate resistance value Rg_off of the lower element 5B, which is the semiconductor switching element 5 of the host arm, based on the signal So corresponding to the target instruction value. Further, in this case, the drive unit 55 stepwise switches the gate resistance value Rg_on of the lower element 5B based on the signal Sp corresponding to the target instruction value. Further, in this case, the drive unit 55 completes the change of the gate resistance values Rg_on and Rg_off by the time the lower element 5B is switched next time. Specifically, the drive unit 55 completes changing the gate resistance value Rg_off by the time the lower element 5B is turned off next time, and changing the gate resistance value Rg_on by the time the lower element 5B is turned on next time.

The specific configuration for realizing such switching of the gate resistance values Rg_off and Rg_on is as follows. That is, in the drive unit 55, the drain of the transistor Q1 is connected to the node N3 via the resistor R31, and is connected to the node N3 via the resistor R32 and the switch 68. Both of the resistors R31 and R32 have a constant resistance value, and, together with the wiring resistance of the path from the DC power supply line 23 to the gate of the lower element 5B, function as a gate resistor when the lower element 5B is turned on.

In other words, the drive unit 55 has a configuration in which two resistors R31 and R32 functioning as a gate resistor during turn-on are connected in parallel between the DC power supply line 23 and the node N3. On and off of the switch 68 is controlled by the signal Sp output from the calculation unit 54. Specifically, the switch 68 is turned off when the signal Sp is at a high level and turned on when the signal Sp is at a low level.

Further, in the drive unit 55, the drain of the transistor Q2 is connected to the node N3 via the resistor R41, and is connected to the node N3 via the resistor R42 and the switch 69. Both of the resistors R41 and R42 have a constant resistance value, and, together with the wiring resistance of the path from the DC power supply line 3 to the gate of the lower element 5B, function as a gate resistor when the lower element 5B is turned off.

In other words, the drive unit 55 has a configuration in which two resistors R41 and R42 functioning as a gate resistor during turn-off are connected in parallel between the DC power supply line 3 and the node N3. On and off of the switch 69 is controlled by the signal So output from the calculation unit 54. Specifically, the switch 69 is turned off when the signal So is at a high level and turned on when the signal So is at a low level.

According to the present embodiment described above, the following effects are obtained.

In the above configuration, when the detection value of dV/dt is greater than the permissible value, the switch 68 is turned off in the drive unit 55, so that the gate resistance value Rg_on becomes a value corresponding to the resistance value of the resistor R31, that is, a relatively large value, and dV/dt at the time of turn-on is suppressed to a relatively small value. Further, in the above configuration, when the detection value of dV/dt is smaller than the permissible value, the switch 68 is turned on in the drive unit 55, so that the gate resistance value Rg_on becomes a value corresponding to the parallel combined resistance value of the resistors R31 and R32, that is, a relatively small value, and dV/dt at the time of turn-on becomes a relatively large value, and high-speed switching can be realized.

In the above configuration, when the detection value of dV/dt is greater than the permissible value, the switch 69 is turned on in the drive unit 55, so that the gate resistance value Rg_off becomes a value corresponding to the resistance value of the resistor R41, that is, a relatively large value, and dV/dt at the time of turn-off is suppressed to a relatively small value. Further, in the above configuration, when the detection value of dV/dt is smaller than the permissible value, the switch 69 is turned on in the drive unit 55, so that the gate resistance value Rg_off becomes a value corresponding to the parallel combined resistance value of the resistors R41 and R42, that is, a relatively small value, and dV/dt at the time of turn-off becomes a relatively large value, and high-speed switching can be realized.

As described above, according to the configuration of the present embodiment, dV/dt at the time of turn-on and turn-off of the semiconductor switching element 5 of the host arm can be controlled so as to become an optimum value, specifically, not to exceed the permissible value and to achieve high-speed switching. Further, according to the configuration of this embodiment, the similar effects to those of the first embodiment and the like can be obtained as follows.

That is, the detection unit 52 detects dV/dt at the time of turn-off during a change period in which the voltage Vds of the semiconductor switching element 5 of the host arm changes. dV/dt at the time of turn-off during the change period has a value corresponding to the magnitude of the surge applied to the main terminal of the semiconductor switching element 5. Thus, also in this case, it can be said that the detection unit 52 detects the magnitude of the surge applied to the main terminal of the semiconductor switching element 5 of the host arm.

The determination unit 53 determines whether the energization to the semiconductor switching element 5 of the host arm during the change period is a forward energization or a reverse energization. Therefore, also in this case, it can be said that the determination unit 53 determines whether the generated surge is a turn-off surge or a recovery surge. The calculation unit 54 calculates the target instruction value corresponding to the switching speed of the semiconductor switching element 5 such that dV/dt becomes equal to or less than the permissible value based on the detection value detected by the detection unit 52 during the change period in which the determination unit 53 determines that the energization to the semiconductor switching element 5 is the forward energization, and the permissible value of dV/dt determined according to the specification of the semiconductor switching element 5. That is, the calculation unit 54 calculates the target instruction value such that the detection value of dV/dt becomes equal to or less than the permissible value based on the detection value corresponding to the magnitude of the surge during the change period in which the generated surge is determined to be a turn-off surge and the permissible value.

The drive unit 55 changes the gate resistance value Rg_off of the semiconductor switching element 5 of the host arm based on the target instruction value calculated by the calculation unit 54, and drives the gate of the semiconductor switching element 5 of the host arm. That is, the drive unit 55 changes the gate resistance value Rg_off based on the target instruction value calculated using the detection result of the surge voltage including only the turn-off surge. According to such a configuration, the magnitude of the turn-off surge can be controlled such that the detection value of dV/dt does not exceed the permissible value and the switching loss does not increase unnecessarily, in other words, the turn-off surge can be appropriately controlled.

In this case, the determination unit 53 detects the voltage Vds during the on-period in which the semiconductor switching element 5 of the host arm is turned on, determines that the energization to the semiconductor switching element 5 of the host arm is the forward energization when the detection value of the voltage Vds is a positive value, and determines that the energization to the semiconductor switching element 5 of the host arm is the reverse energization when the detection value of the voltage Vds is a negative value. As described above, it is considered that the voltage Vds during the on-period changes according to the direction of energization to the semiconductor switching element 5. Therefore, according to the above configuration, it is possible to accurately determine whether the energization to the semiconductor switching element 5 of the host arm is the forward energization or the reverse energization.

Fourth Embodiment

Hereinafter, a fourth embodiment will be described with reference to FIG. 15.

In the present embodiment, the detection result of the surge voltage including a recovery surge can be effectively utilized.

Figure 15:
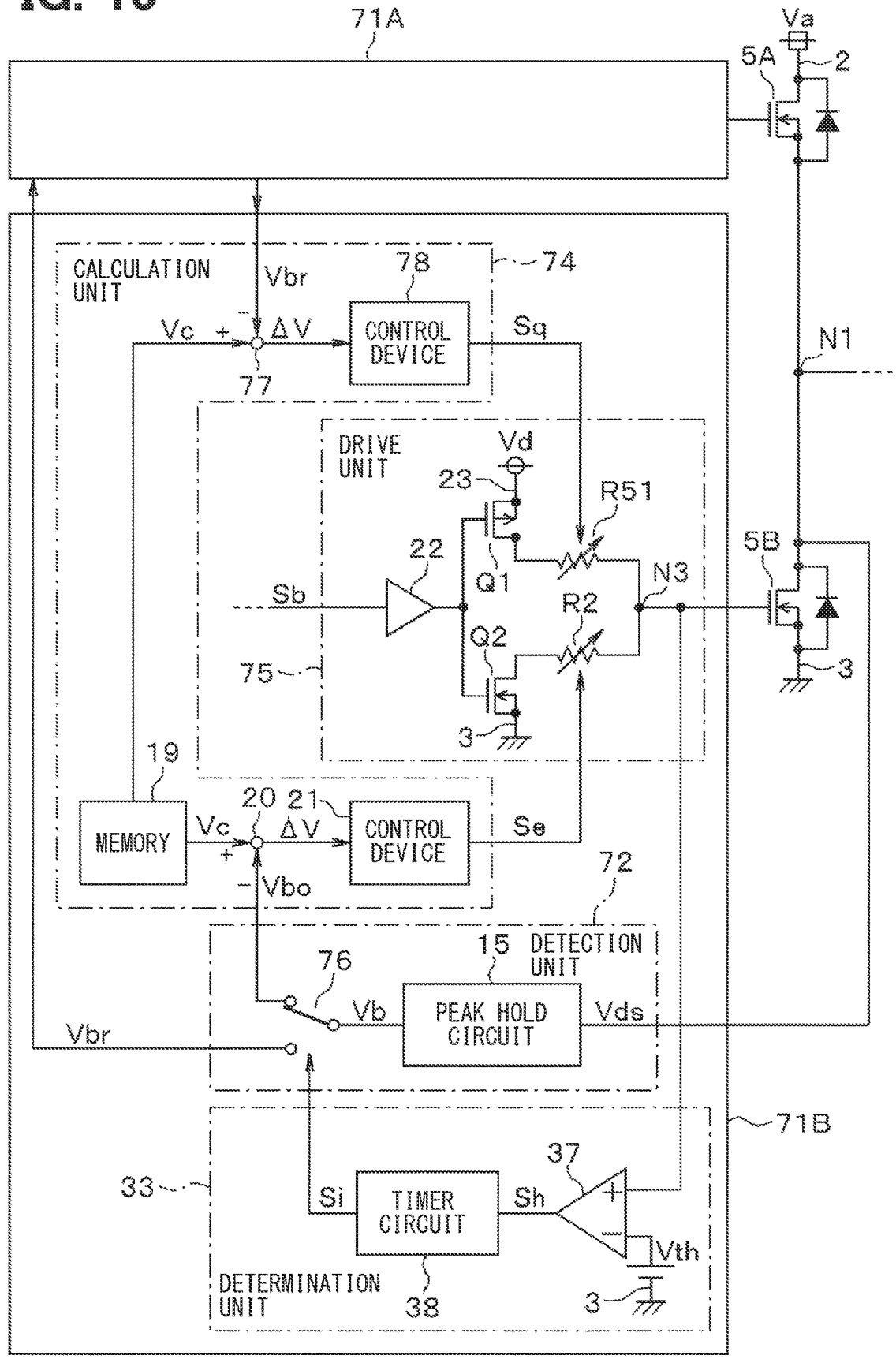
FIG. 15 is a diagram schematically showing a specific configuration example of the gate drive device according to a fourth embodiment.

As illustrated in FIG. 15, each of gate drive devices 71A and 71B of the present embodiment has a detection unit, a determination unit, a calculation unit, and a driving unit each of which has a specific configuration changed with respect to the gate drive device 1B of the first embodiment illustrated in FIG. 6. Here, the gate drive device 71A for driving the upper element 5A has the same configuration as the gate drive device 71B, although illustration and description of the specific configuration are omitted.

The gate drive device 71B includes a detection unit 72, a determination unit 33 similar to the second embodiment, a calculation unit 74, and a drive unit 75. The detection unit 72 has a configuration different from that of the detection unit 11 in that a switching unit 76 is provided instead of the switch 16. An input terminal of the switching unit 76 is supplied with a detection voltage Vb. Based on the level of the signal Si output from the determination unit 33, the switching unit 76 switches between one output terminal and the other output terminal to output the input detection voltage Vb.

As described in the second embodiment, the signal Si is at a high level in the period until the timing at which the determination time elapses from the timing at which the lower element 5B starts to be turned off, and is at a low level in the other period. That is, the period in which the signal Si is at a high level is a period in which a turn-off surge can occur, and the period in which the signal Si is at a low level is a period in which a recovery surge can occur. In this case, the switching unit 76 outputs the detection voltage Vb input from one output terminal when the signal Si is at a high level, and outputs the detection voltage Vb input from the other output terminal when the signal Si is at a low level.

According to such a configuration, the detection voltage Vb output from one output terminal of the switching unit 76 indicates the detection value of the peak value Vds_p at the time of occurrence of the turn-off surge, and is supplied to the subsequent calculation unit 74. Further, according to the above configuration, the detection voltage Vb output from the other output terminal of the switching unit 76 indicates the detection value of the peak value Vds_p at the time of occurrence of the recovery surge, and is supplied to the calculation unit 74 of the gate drive device 71A. In the following description and FIG. 15, the detection voltage Vb corresponding to the turn-off surge that is output from one output terminal of the switching unit 76 is referred to as a detection voltage Vbo, and the detection voltage Vb corresponding to the recovery surge that is output from the other output terminal of the switching unit 76 is referred to as a detection voltage Vbr.

The calculation unit 74 has a different configuration from the calculation unit 13 in that a subtractor 77 and a controller 78 are added. Similarly to the calculation unit 13, the calculation unit 74 calculates the target instruction value such that the peak value Vds_p becomes equal to or less than the permissible value based on the detection value by the detection unit 72 during the change period in which the determination unit 33 determines that the energization of the lower element 5B, which is the semiconductor switching element 5 of the host arm, is the forward energization, and the permissible value of the peak value Vds_p. Further, the calculation unit 74 calculates the target instruction value such that the peak value Vds_p becomes equal to or less than the permissible value based on the peak value Vds_p detected by the detection unit 72 during the change period in which the determination unit 33 determines that the energization of the lower element 5B is the reverse energization, and the permissible value. A specific configuration for implementing such a calculation is as follows.

The permissible voltage Vc is given to the + input of the subtractor 20, and the detection voltage Vbo is given to the − input. The subtractor 20 obtains a deviation ΔV corresponding to the difference between the detection value of the peak value Vds_p when the turn-off surge occurs and the permissible value by subtracting the detection voltage Vbo from the permissible voltage Vc, and outputs the deviation ΔV to the controller 21. The + input of the subtractor 77 is supplied with the permissible voltage Vc, and the − input thereof is supplied with the detection voltage Vbr output from the detection unit 72 of the gate drive device 71A.

The subtractor 77 obtains a deviation ΔV corresponding to the difference between the detection value of the peak value Vds_p when the recovery surge occurs and the permissible value by subtracting the detection voltage Vbr from the permissible voltage Vc, and outputs the deviation ΔV to the controller 78. The controller 78 has a similar configuration to the controller 21, and performs a PID calculation for the deviation ΔV to generate an instruction signal Sq indicating the target instruction value. The instruction signal Sq is output to the drive unit 75.

The drive unit 75, similar to the drive unit 14, changes the gate resistance value Rg_off at the time of turn-off of the semiconductor switching element 5 of the host arm based on the target instruction value calculated by the calculation unit 74. Further, the drive unit 75 changes the gate resistance value Rg_off at the time of turn-on of the semiconductor switching element 5 of the host arm based on the target instruction value calculated by the calculation unit 74 of the gate drive device 71A on the counter arm side. Further, in this case, the drive unit 75 completes the change of the gate resistance value Rg_on by the time the semiconductor switching element 5 of the host arm is turned on next time. In this embodiment, the drive unit 75 continuously switches the gate resistance value Rg_on based on the target instruction value. A specific configuration for implementing such a drive is as follows.

That is, the drive unit 75 is different from the drive unit 14 in that, for example, the resistor R51 is provided instead of the resistor R1. The resistor R51 is configured to be able to change the resistance value thereof based on the instruction signal Sq given from the calculation unit 74. That is, in the above configuration, the gate resistance value Rg_on when the lower element 5B is turned on is changed based on the instruction signal Sq. The resistance value of the resistor R51 can be changed using the same method as that for changing the resistance value of the resistor R2.

Also in the configuration of the present embodiment described above, similarly to the first embodiment, the gate resistance value Rg_off is changed based on the target instruction value calculated by using the detection result of the surge voltage including only the turn-off surge. Therefore, the similar effect to that of the first embodiment, that is, the turn-off surge can be appropriately controlled. Further, in this case, the detection voltage Vbr corresponding to the detection result of the surge voltage including only the recovery surge is transferred between the gate drive devices 71A and 71B.

Then, each of the gate drive devices 71A and 71B calculates the target instruction value, as a second target instruction value, using the detection voltage Vbr transmitted from the gate drive device on the counter arm side, that is, the detection result of the surge voltage including only the recovery surge, and changes the gate resistance Rg_on based on the target instruction value. According to such a configuration, the magnitude of the recovery surge can be controlled such that the peak value Vds_p of the voltage Vds does not exceed the permissible value and the switching loss does not increase unnecessarily, in other words, the recovery surge can be appropriately controlled.

Further, in this case, the drive unit 75 completes the change of the gate resistance value Rg_on by the time the semiconductor switching element 5 of the host arm is turned on next time. That is, in the present embodiment, when the target instruction value is calculated based on the detection value of the peak value Vds_p of the voltage Vds in the predetermined drive cycle, the calculation result is actually reflected in the gate resistance value Rg_on at the time when the semiconductor switching element 5 of the host arm is next turned on. According to such control, the optimization of the gate resistance value Rg_on can be promptly and reliably achieved. In other words, it is possible to attain the maximum effect.

Fifth Embodiment

Figure 16:
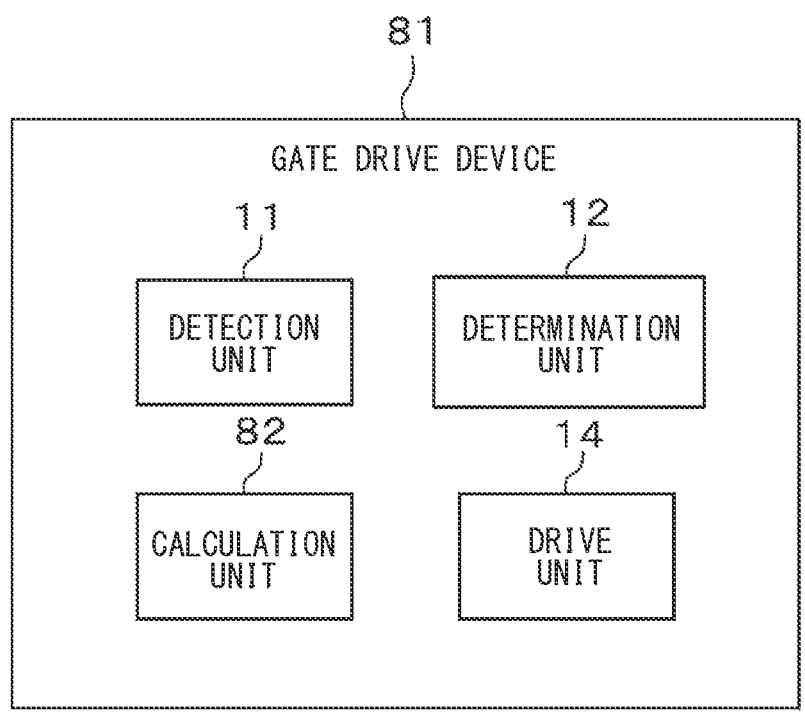
FIG. 16 is a diagram schematically illustrating each function of a gate drive device according to a fifth embodiment.

Hereinafter, a fifth embodiment will be described with reference to FIG. 16.

The present embodiment is different from the first embodiment in some of the functions of the gate drive device. That is, as illustrated in FIG. 16, a gate drive device 81 is different from the gate drive device 1 in that a calculation unit 82 is provided instead of the calculation unit 13.

In general, an element withstand voltage, that is, a surge withstand voltage of a semiconductor switching element 5 depends on a temperature around the semiconductor switching element 5. Specifically, the higher an ambient temperature, the higher the element withstand voltage, and the lower the ambient temperature, the lower the element withstand voltage. When the semiconductor switching element 5 is driven at a predetermined gate resistance value, when a load current IL fluctuates, a surge voltage also fluctuates according to the fluctuation. Specifically, when the gate resistance value is constant, a peak of the surge voltage increases as the load current IL increases, and the peak of the surge voltage decreases as the load current IL decreases. Similarly to the load current IL, it can be said that the same applies to a current Id flowing through the semiconductor switching element 5.

When the semiconductor switching element 5 is driven at a predetermined gate resistance value, when a power supply voltage Va fluctuates, the surge voltage also fluctuates according to the fluctuation. Specifically, when the gate resistance value is constant, the peak of the surge voltage increases as the power supply voltage Va increases, and the peak of the surge voltage decreases as the power supply voltage Va decreases. Similarly to the power supply voltage Va, it can be said that the same applies to an off-voltage Vds_off of the semiconductor switching element 5.

In a state where the gate resistance value is optimized, when the surge voltage increases with changes in the ambient temperature, the load current IL, the power supply voltage Va, and the like described above, a voltage exceeding the element withstand voltage may be applied to a main terminal of the semiconductor switching element 5. In a state where the gate resistance value is optimized, when the surge voltage decreases with the changes in the ambient temperature, the load current IL, the power supply voltage Va, and the like described above, the gate resistance value is set to be higher than necessary, and a switching loss increases accordingly.

In consideration of such a point, the calculation unit 82 acquires, as a fluctuation parameter, at least one of the ambient temperature, the load current IL, and the power supply voltage Va, and changes a permissible value of the peak value Vds_p based on a relationship between the acquired fluctuation parameter and the value detected by the detection unit 11. By doing this, even when the ambient temperature, the load current IL, and the power supply voltage Va fluctuate, the gate resistance value can be optimized in consideration of these fluctuations, that is, disturbance. Accordingly, according to the present embodiment, the turn-off surge can be appropriately controlled regardless of the fluctuations in the ambient temperature, the load current, the power supply voltage Va, and the like.

Sixth Embodiment

Figure 17:
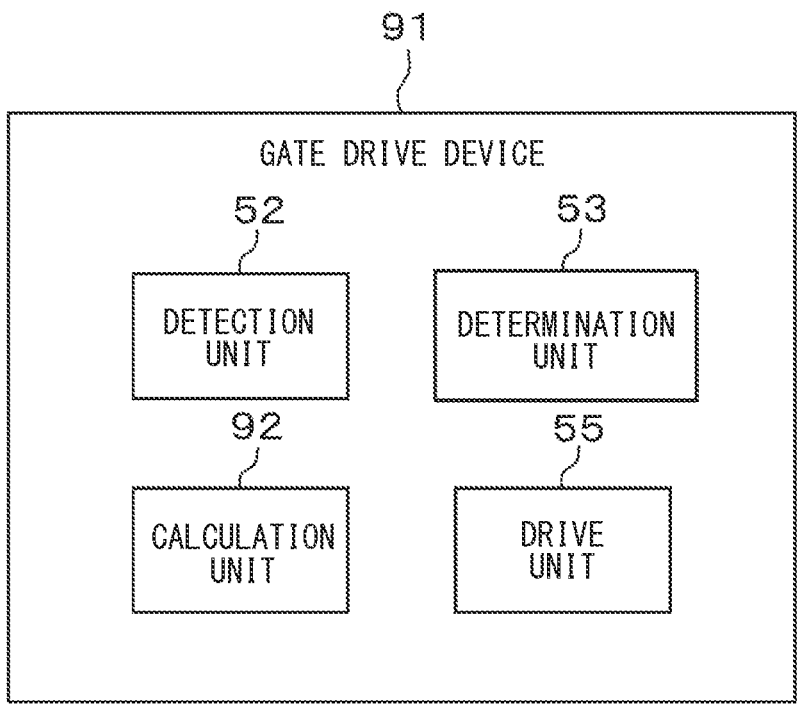
FIG. 17 is a diagram schematically illustrating each function of a gate drive device according to a sixth embodiment.

Hereinafter, a sixth embodiment will be described with reference to FIG. 17.

The present embodiment is different from the third embodiment in some of the functions of the gate drive device. That is, as illustrated in FIG. 17, a gate drive device 91 is different from the gate drive device 51 in that a calculation unit 92 is provided instead of the calculation unit 54.

Similarly to the surge voltage, the fluctuations in the ambient temperature, the load current IL, and the power supply voltage Va affect dV/dt. In general, an allowable value for dV/dt of the semiconductor switching element 5 depends on an ambient air pressure. Specifically, the higher the ambient air pressure, the higher the allowable value may be.

In a state where the gate resistance value is optimized, when dV/dt increases with changes in the above-described ambient temperature, the ambient air pressure, the load current IL, the power supply voltage Va, and the like, dV/dt may exceed the allowable value. In a state where the gate resistance value is optimized, when dV/dt decreases with changes in the ambient temperature, the load current IL, the power supply voltage Va, and the like described above, the gate resistance value is set to be higher than necessary, and the switching loss increases accordingly.

In consideration of such a point, the calculation unit 92 acquires, as a fluctuation parameter, at least one of the ambient temperature, the ambient air pressure, the load current IL, and the power supply voltage Va, and changes a permissible value of dV/Dt based on a relationship between the acquired fluctuation parameter and the value detected by the detection unit 52. By doing this, even when the ambient temperature, the ambient air pressure, the load current IL, and the power supply voltage Va fluctuate, the gate resistance value can be optimized in consideration of these fluctuations, that is, disturbance. Accordingly, according to the present embodiment, dV/dt can be appropriately controlled regardless of the fluctuations in the ambient temperature, the ambient air pressure, the load current, the power supply voltage Va, and the like.

Other Embodiments

The present disclosure is not limited to the embodiments that have been described above and illustrated in the drawings, but can arbitrarily be modified, combined, or expanded without departing from the gist of the present disclosure.

The numerical values and the like illustrated in each of the above embodiments are merely examples, and the present disclosure is not limited thereto.

The drive units 14, 35, 55, and 75 are configured to change the gate resistance value of the semiconductor switching element 5 of the host arm based on the calculated target instruction value. Alternatively, the gate resistance value of the semiconductor switching element 5 of the host arm may be changed based on the calculated target instruction value. Even when the configuration is changed to such a configuration, the same effects as the effects of the above-described embodiments are obtained.

The gate drive device in each embodiment described above can treat, as a drive subject, not only an N-channel MOSFET, but also various types of semiconductor switching element such as a P-channel MOSFET or an IGBT.

Although the present disclosure has been described in accordance with the examples, it is understood that the present disclosure is not limited to such examples or structures. The present disclosure encompasses various modifications and variations within the scope of equivalents. In addition, various combinations and configurations, as well as other combinations and configurations that include only one element, more, or less, fall within the scope and spirit of the present disclosure.

What is claimed is:

1. A gate drive device configured to drive a gate of each of two semiconductor switching elements constituting upper and lower arms of a half bridge circuit, the gate drive device comprising:
   a detection unit configured to detect, as a detection value, a peak value of an element voltage that is a voltage of a main terminal of one of the two semiconductor switching elements, as one semiconductor switching element, or a change rate of the element voltage during a change period in which the element voltage changes;
   a determination unit configured to determine whether an energization to the one semiconductor switching element during the change period is a forward energization in which a current flows in a forward direction or a reverse energization in which the current flows in a reverse direction;
   a calculation unit configured to calculate a target instruction value corresponding to a switching speed of the one semiconductor switching element such that the peak value or the change rate becomes equal to or less than a permissible value of the peak value or the change rate determined according to a specification of the one semiconductor switching element based on the detection value during the change period in which the determination unit determines that the energization to the one semiconductor switching element is the forward energization, and the permissible value; and
   a drive unit configured to change a gate resistance value or a gate current value of the one semiconductor switching element based on the target instruction value, and drive the gate of the one semiconductor switching element.

2. The gate drive device according to claim 1, wherein the detection unit detects the peak value of the element voltage during the change period,
   the calculation unit calculates the target instruction value corresponding to the switching speed such that the peak value becomes equal to or less than the permissible value based on the peak value during the change period in which the determination unit determines that the energization to the one semiconductor switching element is the forward energization, and the permissible value, and
   the drive unit changes the gate resistance value or the gate current value when the one semiconductor switching element is turned off based on the target instruction value.

3. The gate drive device according to claim 2, wherein the drive unit completes changing the gate resistance value or the gate current value until the one semiconductor switching element is turned off next time.

4. The gate drive device according to claim 1, wherein the calculation unit calculates a second target instruction value corresponding to a switching speed of an other semiconductor switching element of the two semiconductor switching elements such that the peak value becomes equal to or less than the permissible value based on the peak value during the change period in which the determination unit determines that the energization to the one semiconductor switching element is the reverse energization, and the permissible value, and
   the drive unit changes the gate resistance value or the gate current value when the other semiconductor switching element is turned on based on the second target instruction value.

5. The gate drive device according to claim 4, wherein the drive unit completes changing the gate resistance value or the gate current value until the other semiconductor switching element is turned on next time.

6. The gate drive device according to claim 1, wherein the detection unit detects the change rate of the element voltage during the change period,
   the calculation unit calculates the target instruction value corresponding to the switching speed such that the change rate becomes equal to or less than the permissible value based on the change rate during the change period in which the determination unit determines that the energization to the one semiconductor switching element is the forward energization, and the permissible value, and
   the drive unit changes the gate resistance value or the gate current value when the one semiconductor switching element is switching based on the target instruction value.

7. The gate drive device according to claim 6, wherein the drive unit completes changing the gate resistance value or the gate current value until the one semiconductor switching element is switching next time.

8. The gate drive device according to claim 1, wherein the determination unit determines that the energization to the one semiconductor switching element is the forward energization in a period before a point in time when a predetermined determination time elapses from a timing at which the one semiconductor switching element starts to be turned off, and the determination unit determines that the energization to the one semiconductor switching element is the reverse energization in a period after the point in time when the predetermined determination time elapses.

9. The gate drive device according to claim 1, wherein the determination unit directly or indirectly detects a direction of an element current which is a current flowing through the one semiconductor switching element, determines that the energization to the one semiconductor switching element is the forward energization when the element current flows in a forward direction, and determines that the energization to the one semiconductor switching element is the reverse energization when the element current flows in a reverse direction.

10. The gate drive device according to claim 1, wherein the determination unit detects the element voltage during an on-period in which the one semiconductor switching element is turned on, determines that the energization to the one semiconductor switching element is the forward energization when a value of the element voltage is positive, and determines that the energization to the one semiconductor switching element is the reverse energization when the value of the element voltage is negative.

11. The gate drive device according to claim 1, wherein the calculation unit compares the detection value with one or more threshold values set corresponding to the permissible value of the peak value or the change rate, and calculates, as the target instruction value, a value indicating a comparison result, and the drive unit stepwise switches the gate resistance value or the gate current value of the one semiconductor switching element based on the target instruction value.

12. The gate drive device according to claim 1, wherein the calculation unit calculates the target instruction value such that a deviation between the detection value and the permissible value of the peak value or the change rate is zero, and the drive unit continuously switches the gate resistance value or the gate current value of the one semiconductor switching element based on the target instruction value.

13. The gate drive device according to claim 1, wherein the calculation unit acquires, as a fluctuation parameter, at least one of an ambient temperature, an ambient air pressure, an output current of the half bridge circuit, and a power supply voltage supplied to the half bridge circuit, and changes the permissible value of the peak value or the change rate based on a relationship between the acquired fluctuation parameter and the peak value or the change rate.

14. A gate drive device configured to drive a gate of each of two semiconductor switching elements constituting upper and lower arms of a half bridge circuit, the gate drive device comprising:

a detection circuit configured to detect, as a detection value, a peak value of an element voltage that is a voltage of a main terminal of one of the two semiconductor switching elements, as one semiconductor switching element, or a change rate of the element voltage during a change period in which the element voltage changes;

a determination circuit configured to determine whether an energization to the one semiconductor switching element during the change period is a forward energization in which a current flows in a forward direction or a reverse energization in which the current flows in a reverse direction;

a calculation circuit configured to calculate a target instruction value corresponding to a switching speed of the one semiconductor switching element such that the peak value or the change rate becomes equal to or less than a permissible value of the peak value or the change rate determined according to a specification of the one semiconductor switching element based on the detection value during the change period in which the determination circuit determines that the energization to the one semiconductor switching element is the forward energization, and the permissible value; and a drive circuit configured to change a gate resistance value or a gate current value of the one semiconductor switching element based on the target instruction value, and drive the gate of the one semiconductor switching element.

* * * * *